(12) United States Patent
Choi

(10) Patent No.: US 11,764,144 B2
(45) Date of Patent: *Sep. 19, 2023

(54) STORAGE SYSTEM INCLUDING A DECOUPLING DEVICE HAVING A PLURALITY OF UNIT CAPACITORS

(71) Applicant: SK hynix Inc., Icheon-si Gyeonggi-do (KR)

(72) Inventor: Bok Kyu Choi, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,628

(22) Filed: Feb. 17, 2022

(65) Prior Publication Data

US 2022/0173030 A1  Jun. 2, 2022

Related U.S. Application Data

(63) Continuation of application No. 17/148,194, filed on Jan. 13, 2021, now Pat. No. 11,264,319.

(30) Foreign Application Priority Data

Aug. 20, 2020 (KR) ........................ 10-2020-0104581

(51) Int. Cl.
| | | |
|---|---|---|
| *H01L 23/522* | (2006.01) | |
| *G11C 5/04* | (2006.01) | |
| *H01L 49/02* | (2006.01) | |
| *G11C 5/06* | (2006.01) | |
| *G11C 11/4074* | (2006.01) | |

(52) U.S. Cl.
CPC ............ *H01L 23/5223* (2013.01); *G11C 5/04* (2013.01); *G11C 5/06* (2013.01); *G11C 11/4074* (2013.01); *H01L 28/40* (2013.01)

(58) Field of Classification Search
None
See application file for complete search history.

(56) References Cited

U.S. PATENT DOCUMENTS

| | | |
|---|---|---|
| 6,449,166 B1 | 9/2002 | Sly et al. |
| 7,948,784 B2 | 5/2011 | Kajigaya |
| 8,089,795 B2 | 1/2012 | Rajan et al. |

(Continued)

FOREIGN PATENT DOCUMENTS

KR   1020170030307 A   3/2017

*Primary Examiner* — Tan T. Nguyen

(74) *Attorney, Agent, or Firm* — WILLIAM PARK & ASSOCIATES LTD.

(57) ABSTRACT

Provided is a storage system including a decoupling device having a plurality of unit capacitors. The storage system includes a storage device, a control device, and a decoupling device disposed on a circuit substrate. The storage device is configured to receive and store data from the control device. The control device is configured to generate an inner voltage. The decoupling device is connected to the control device and decouples the inner voltage. The decoupling device includes a plurality of unit capacitors constituting a plurality of decoupling capacitors. Each of the unit capacitors includes a plurality of capacitor elements, a first terminal, and a second terminal. Some of the unit capacitors are selectively connected with each other to constitute the decoupling capacitors having various capacitances.

19 Claims, 27 Drawing Sheets

(56) References Cited

U.S. PATENT DOCUMENTS

| | | |
|---|---|---|
| 8,477,554 B2 | 7/2013 | Yu et al. |
| 11,264,319 B1 * | 3/2022 | Choi .................. G11C 11/4074 |
| 2009/0179669 A1 * | 7/2009 | Bartley .................... G06F 1/26 |
| | | 326/82 |
| 2011/0058401 A1 | 3/2011 | Dono et al. |
| 2011/0199808 A1 | 8/2011 | Yi et al. |
| 2013/0286707 A1 | 10/2013 | Crisp et al. |
| 2014/0192583 A1 | 7/2014 | Rajan et al. |

* cited by examiner

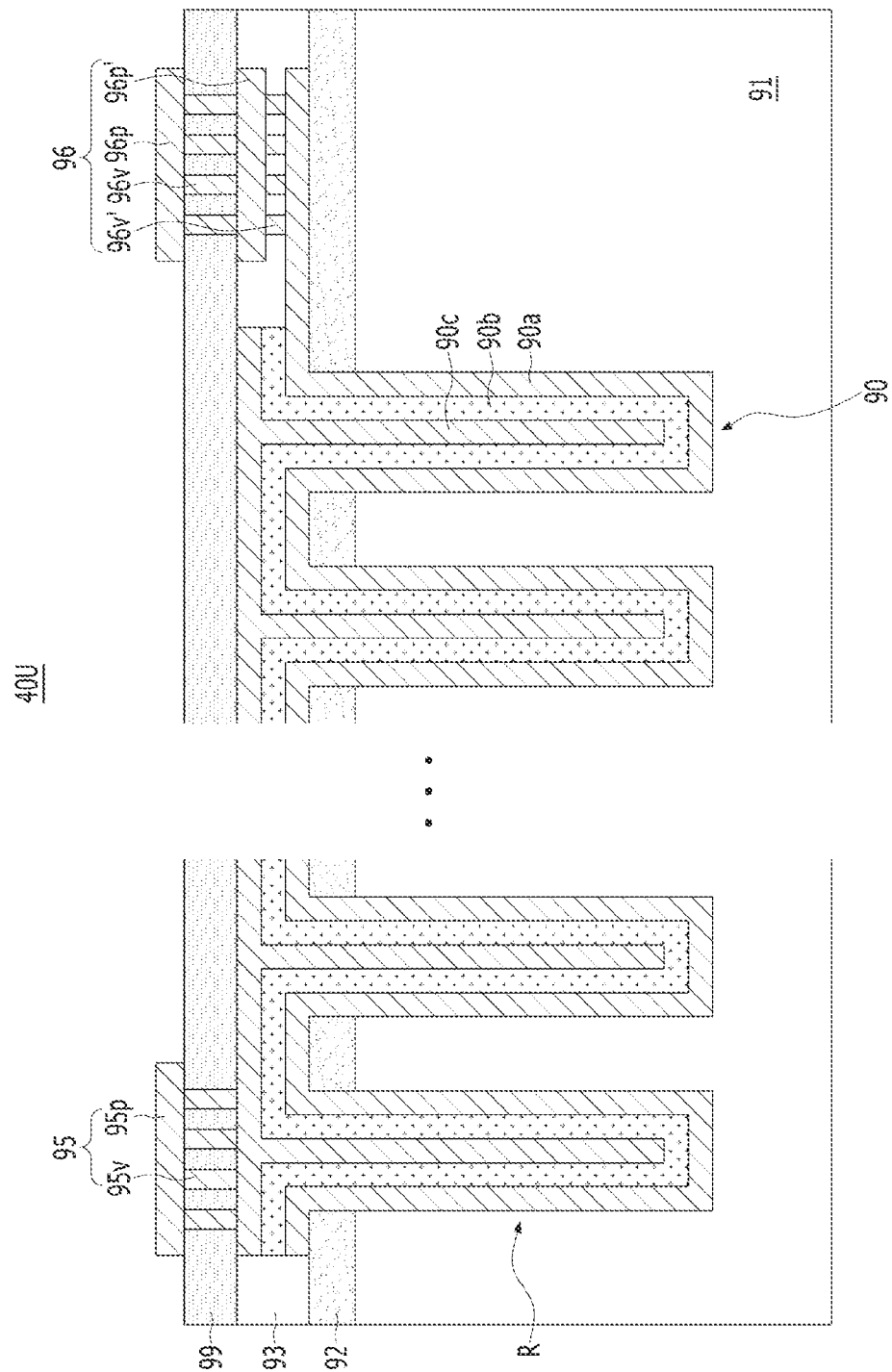

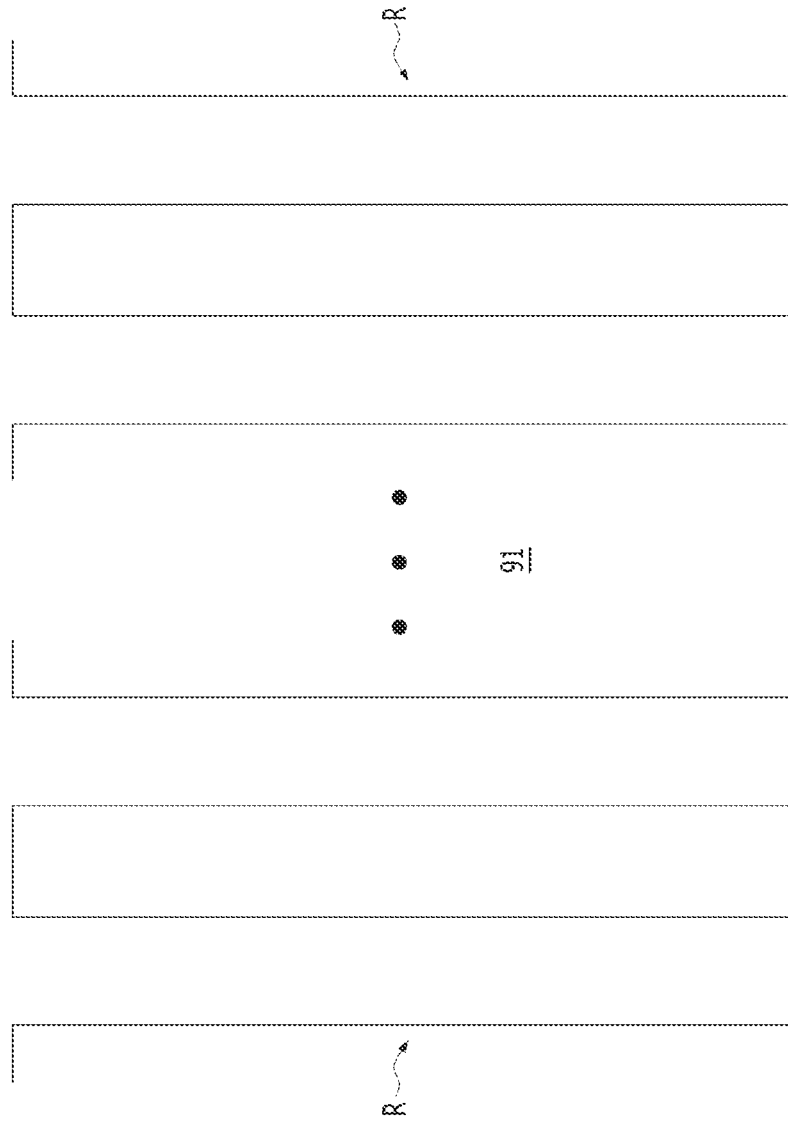

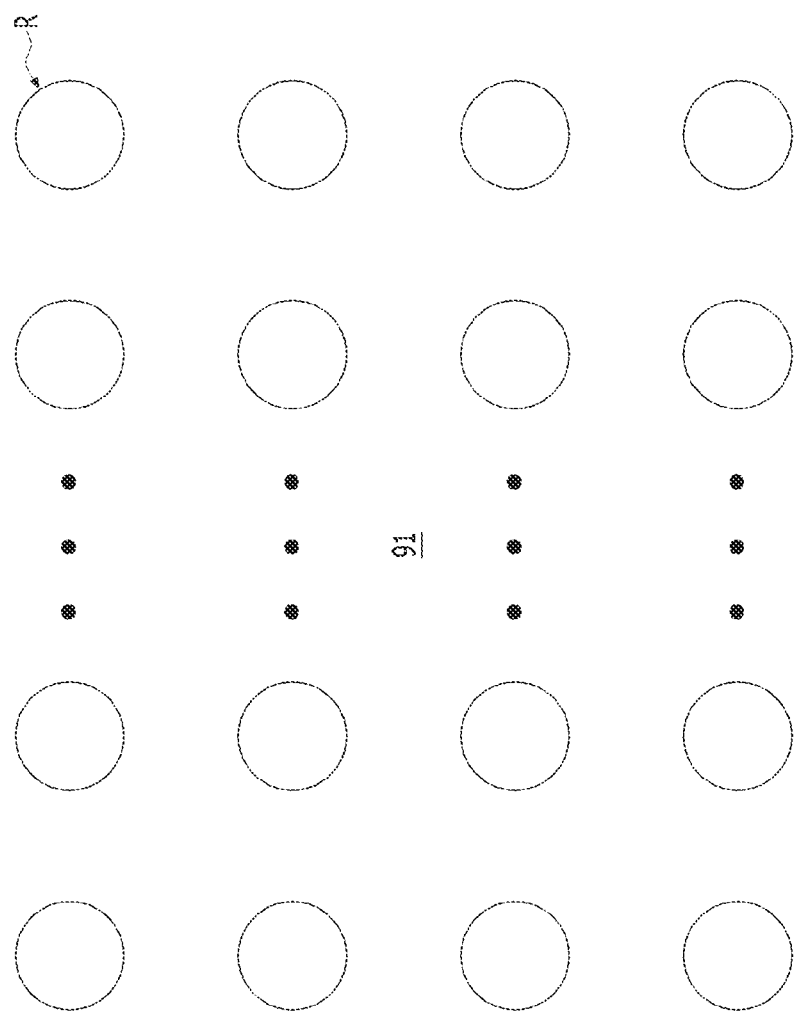

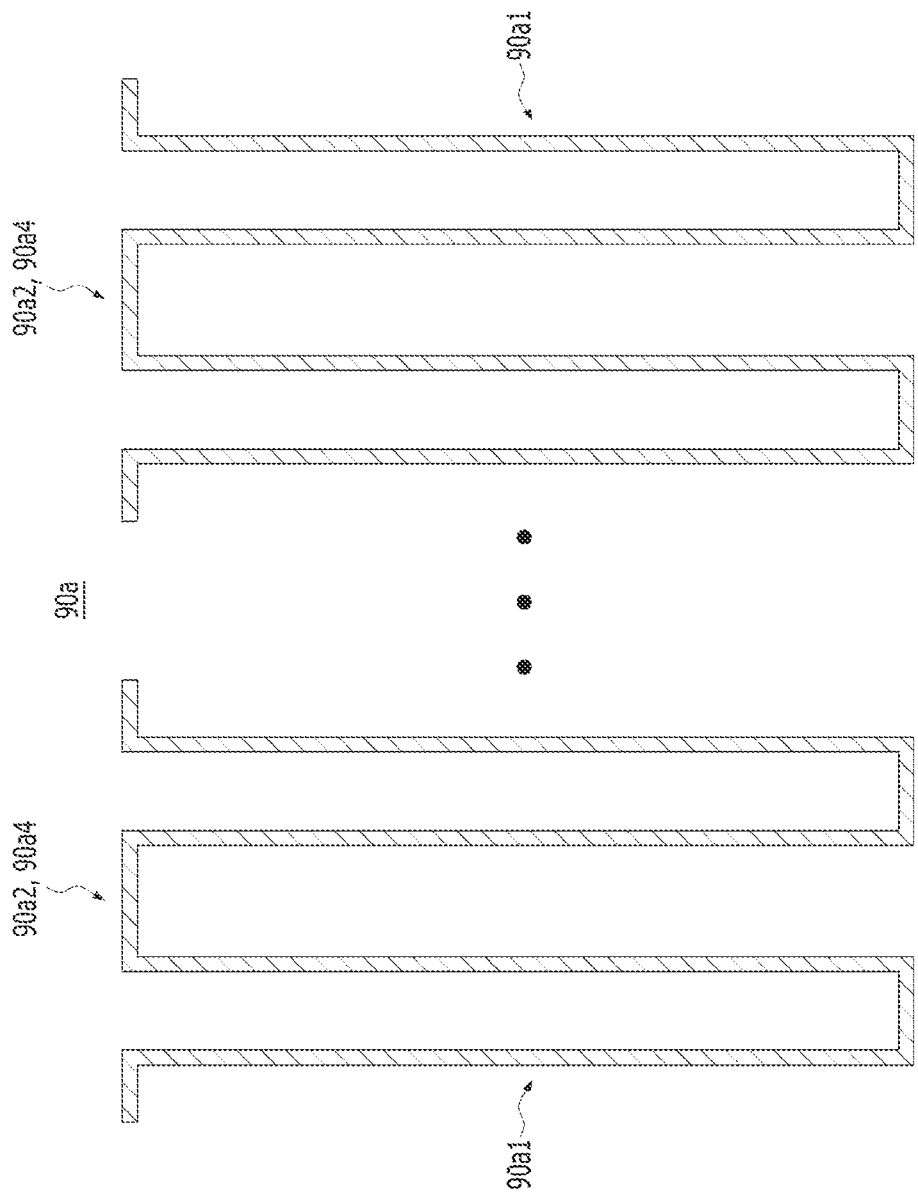

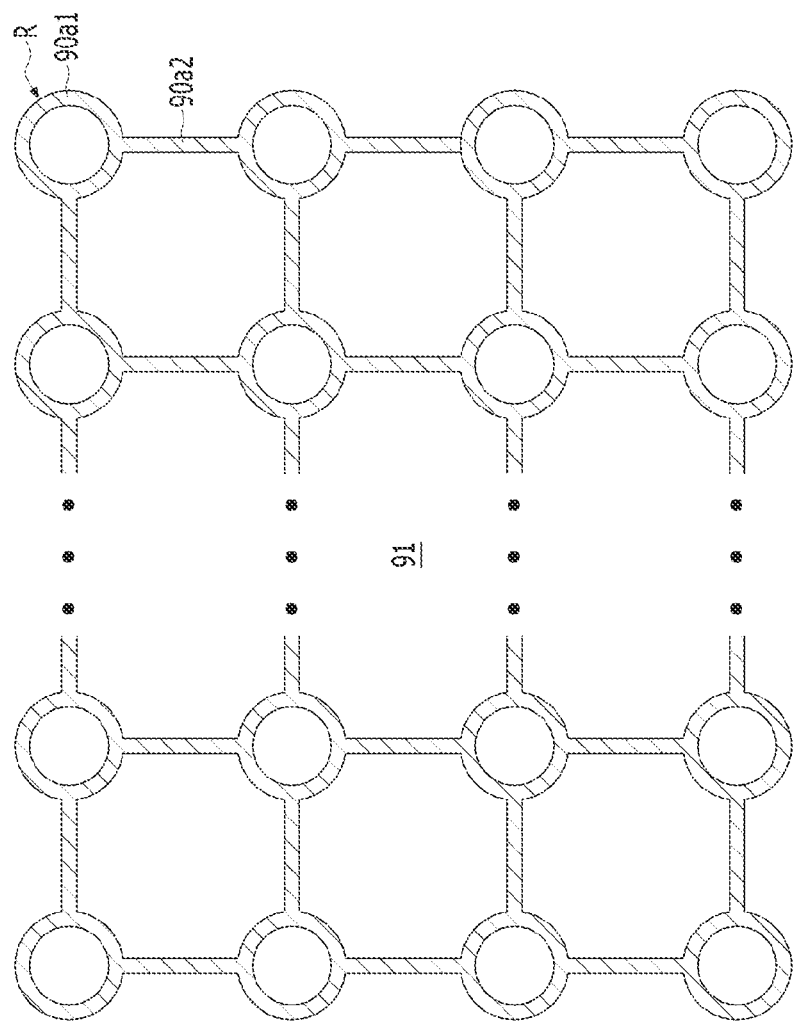

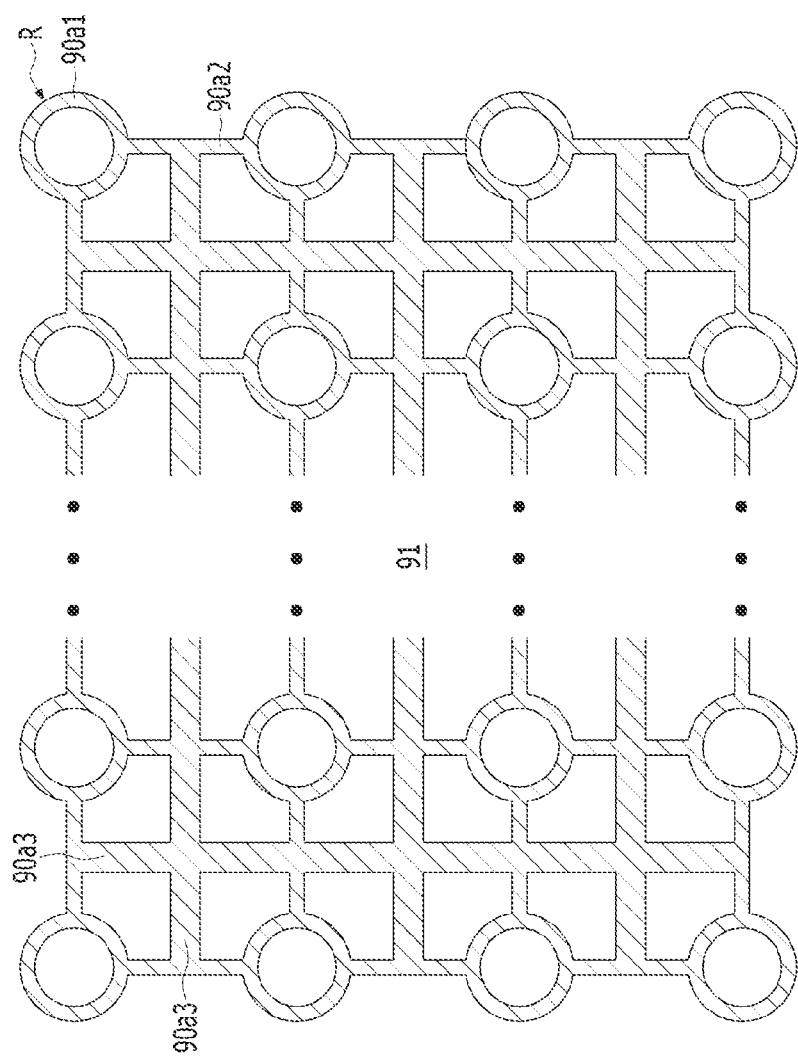

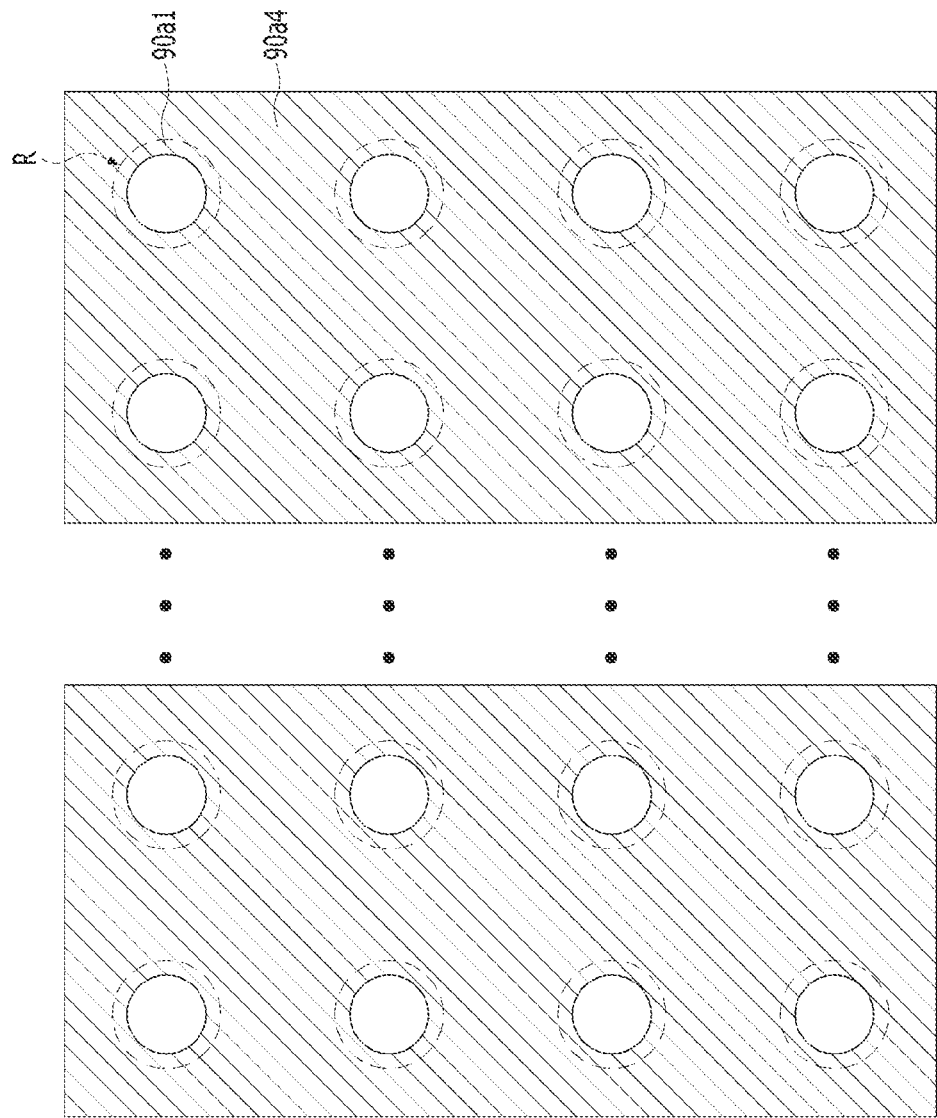

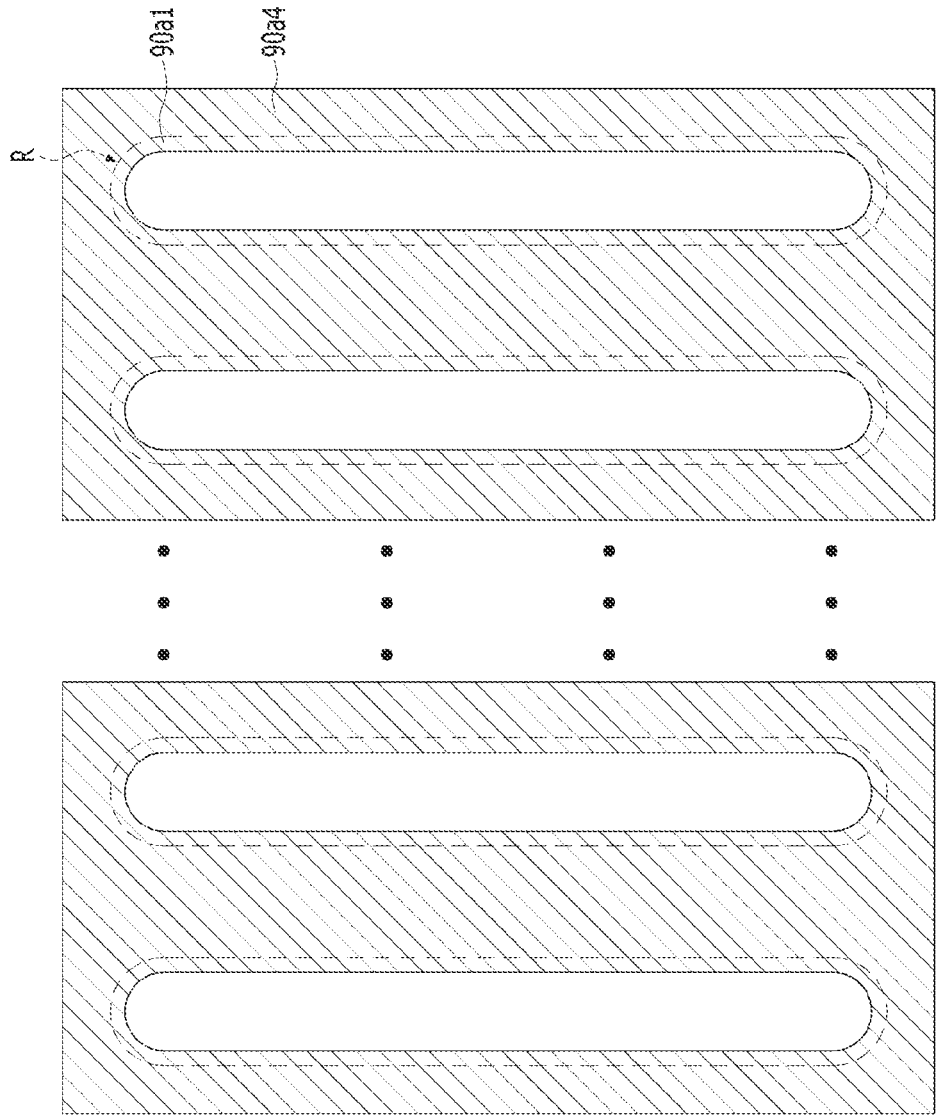

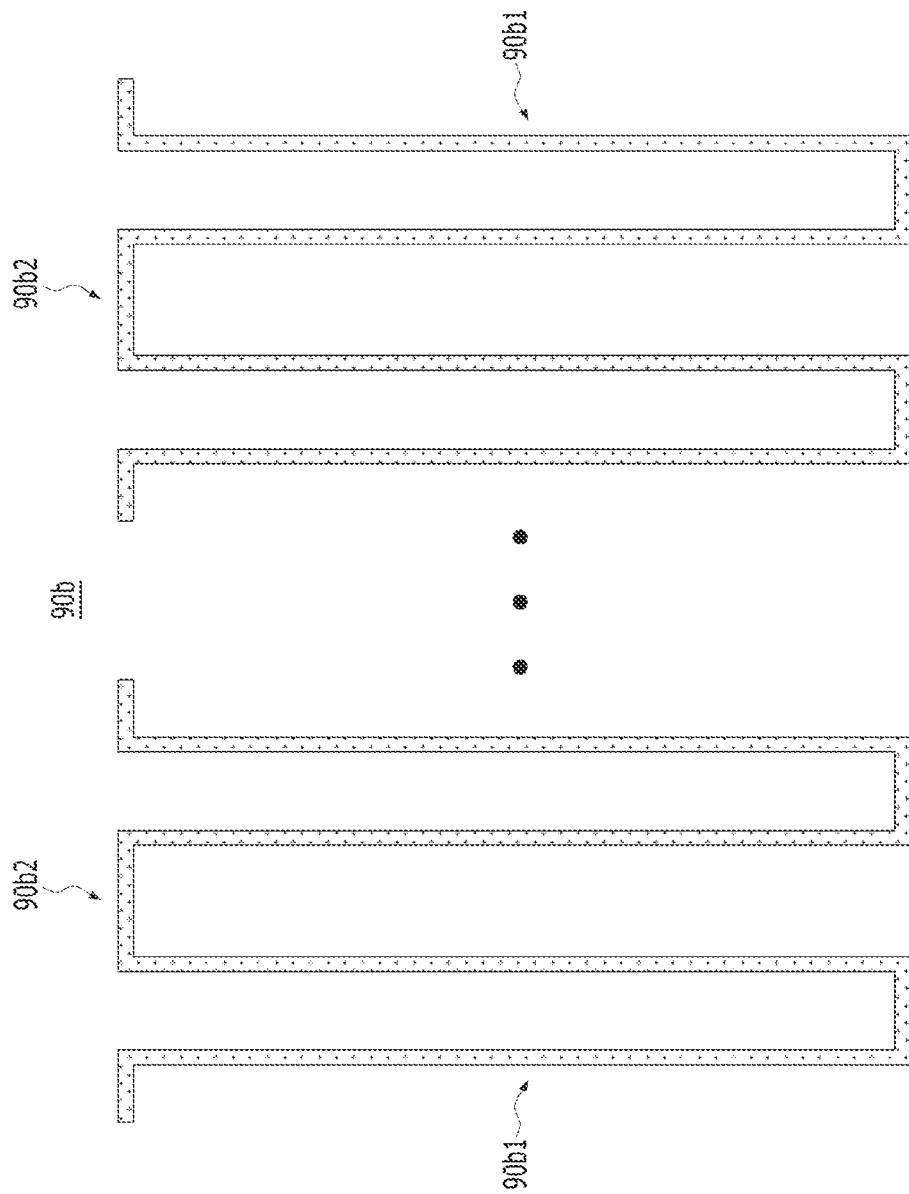

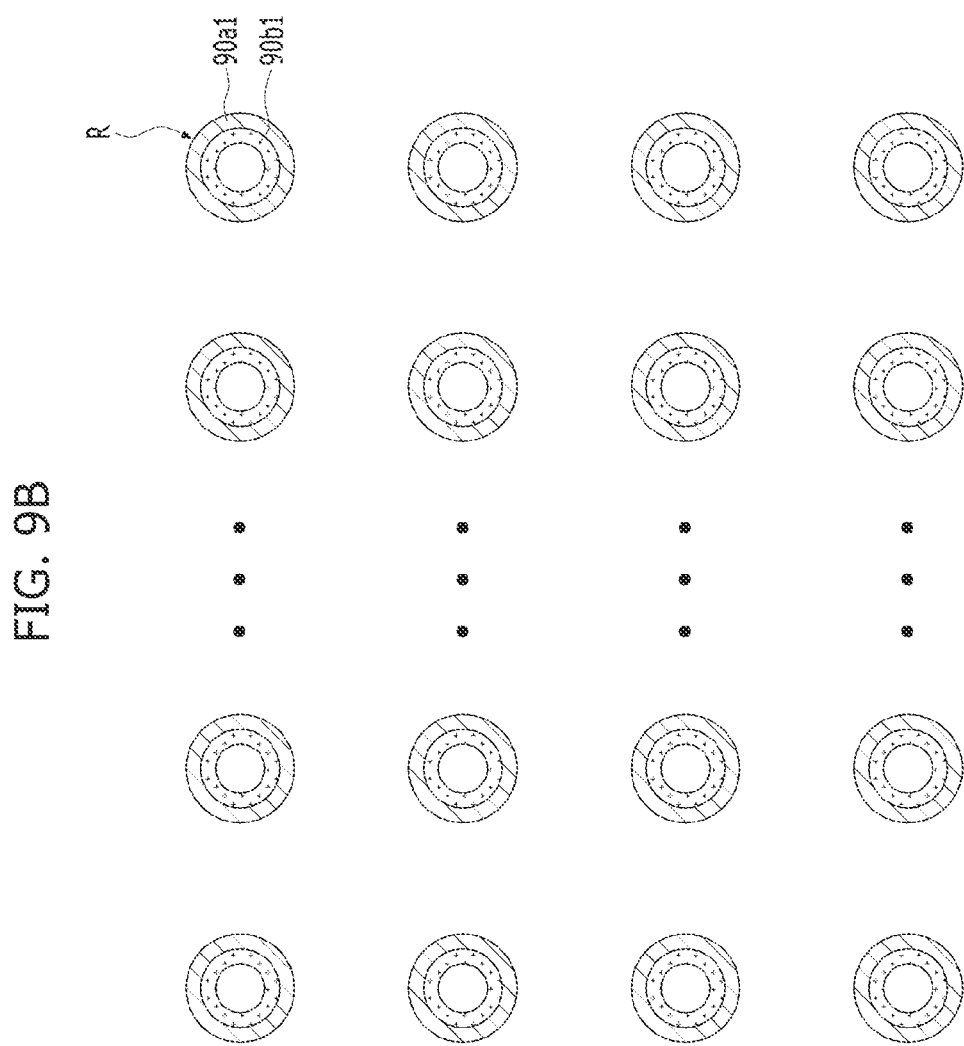

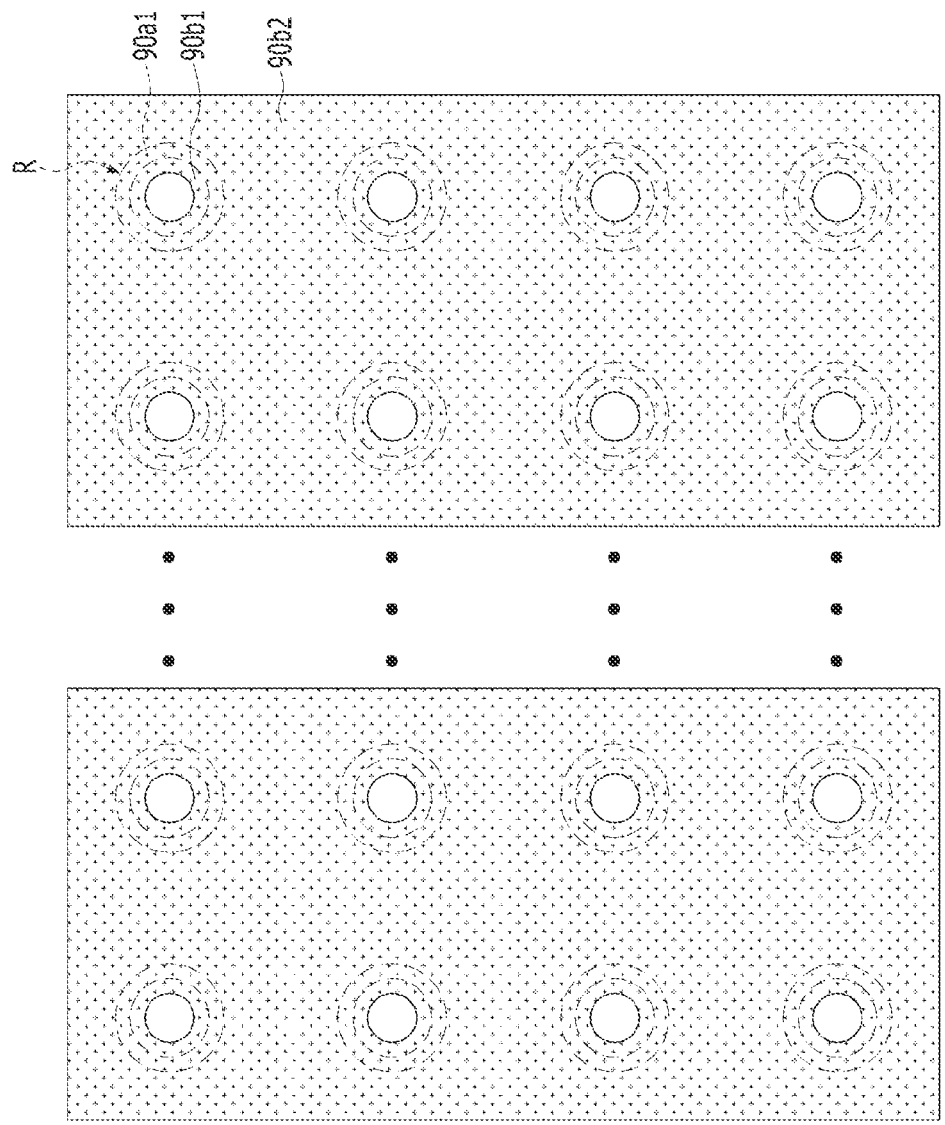

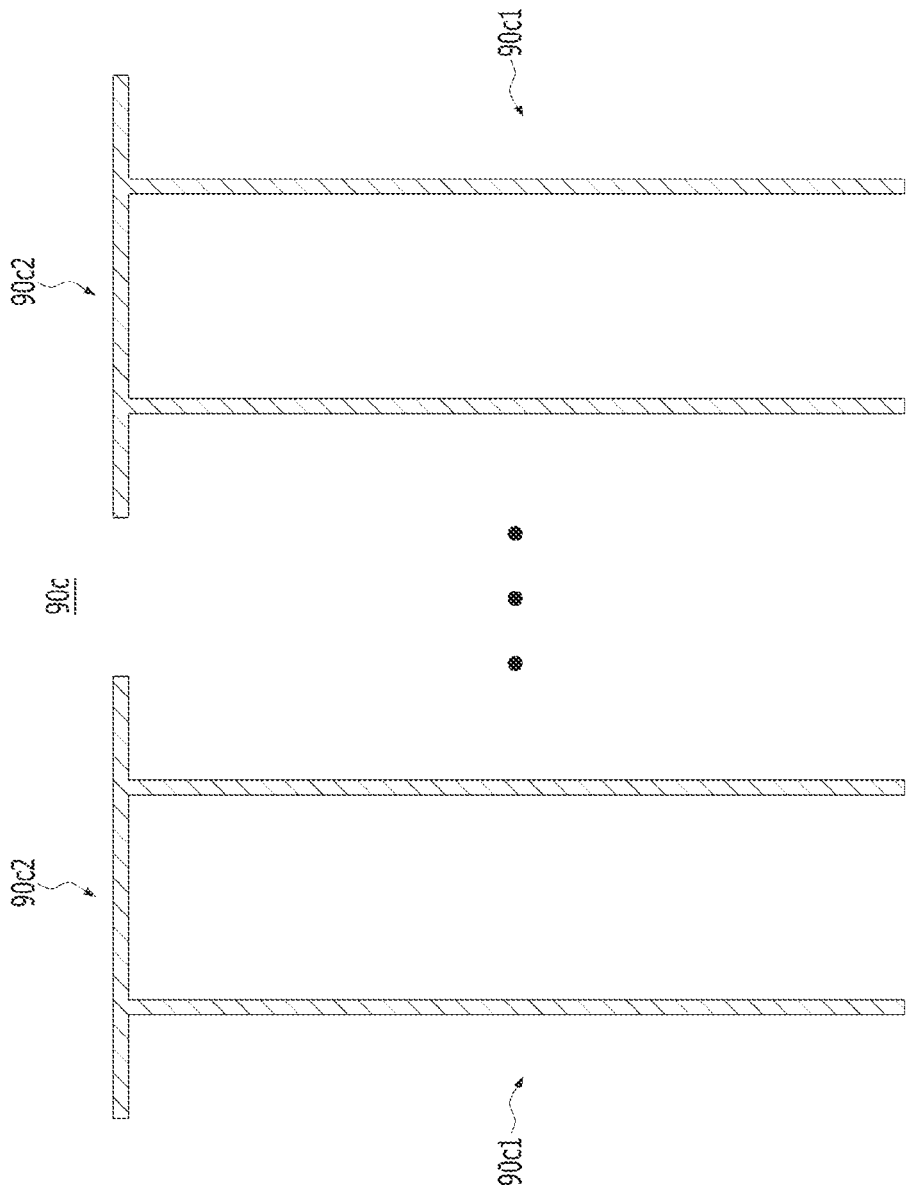

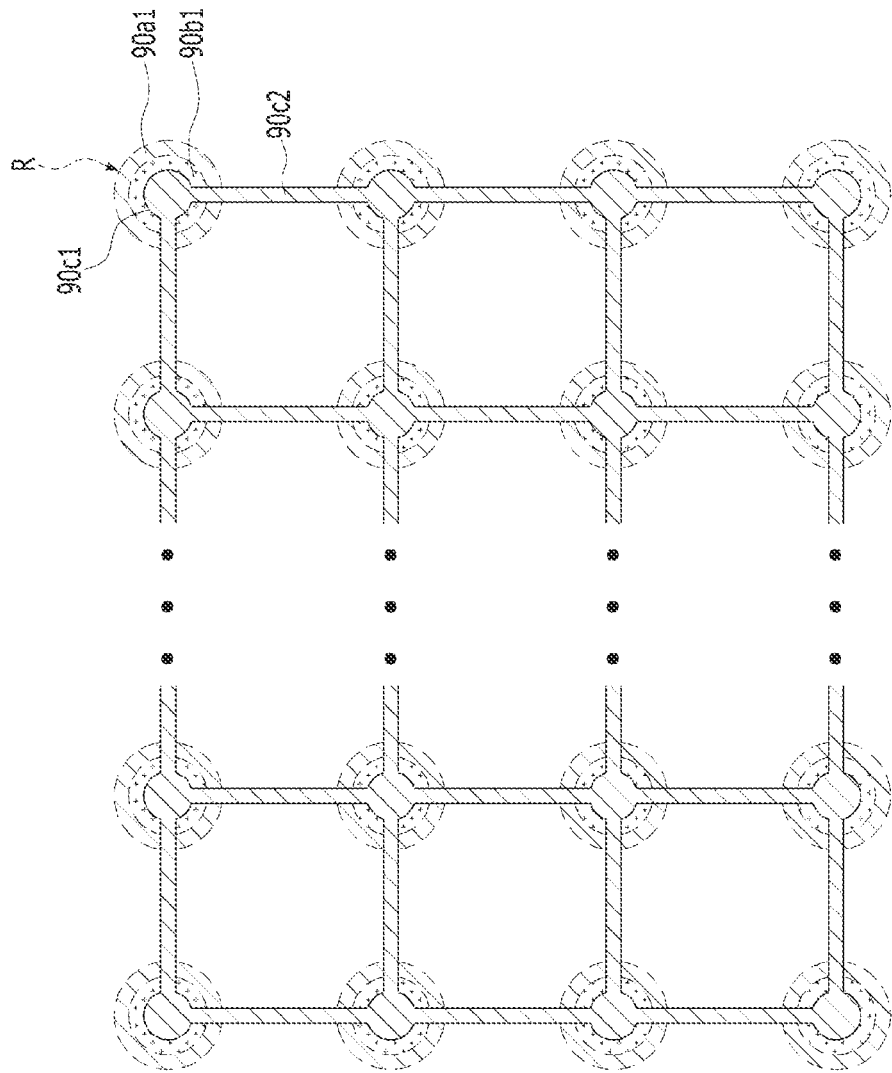

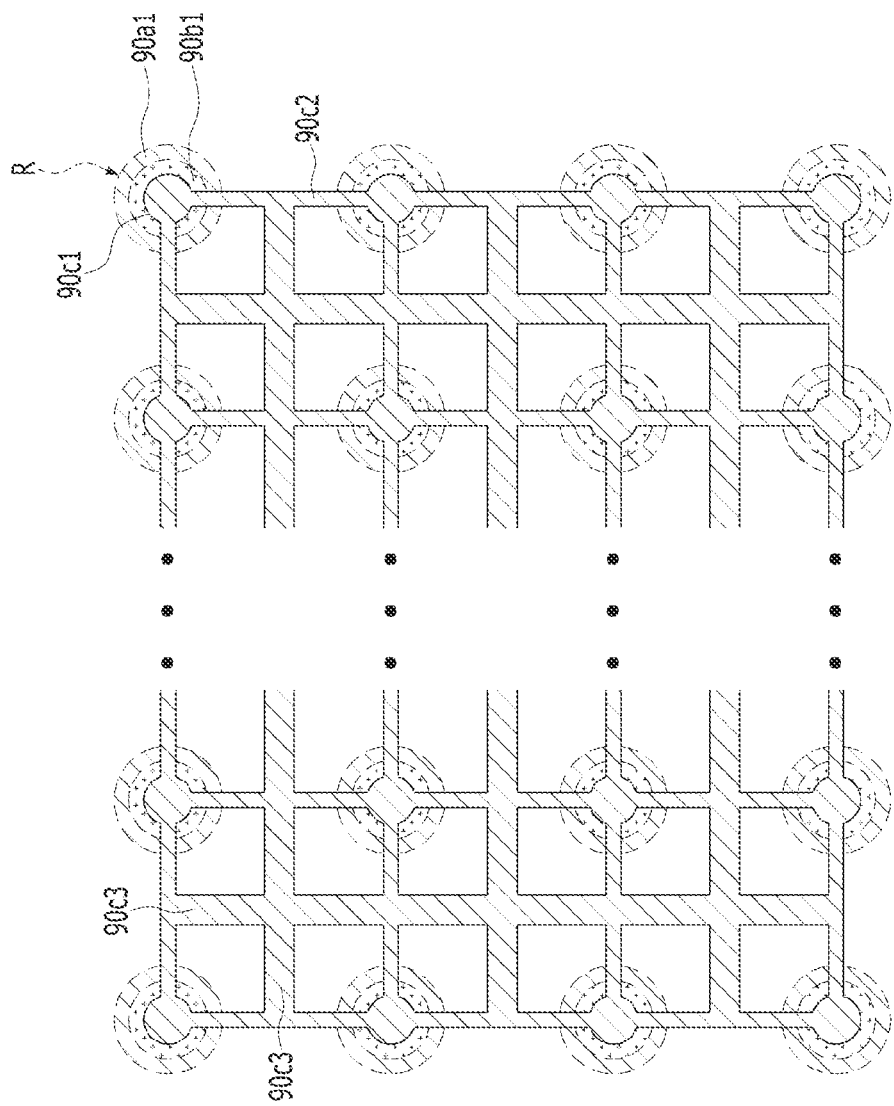

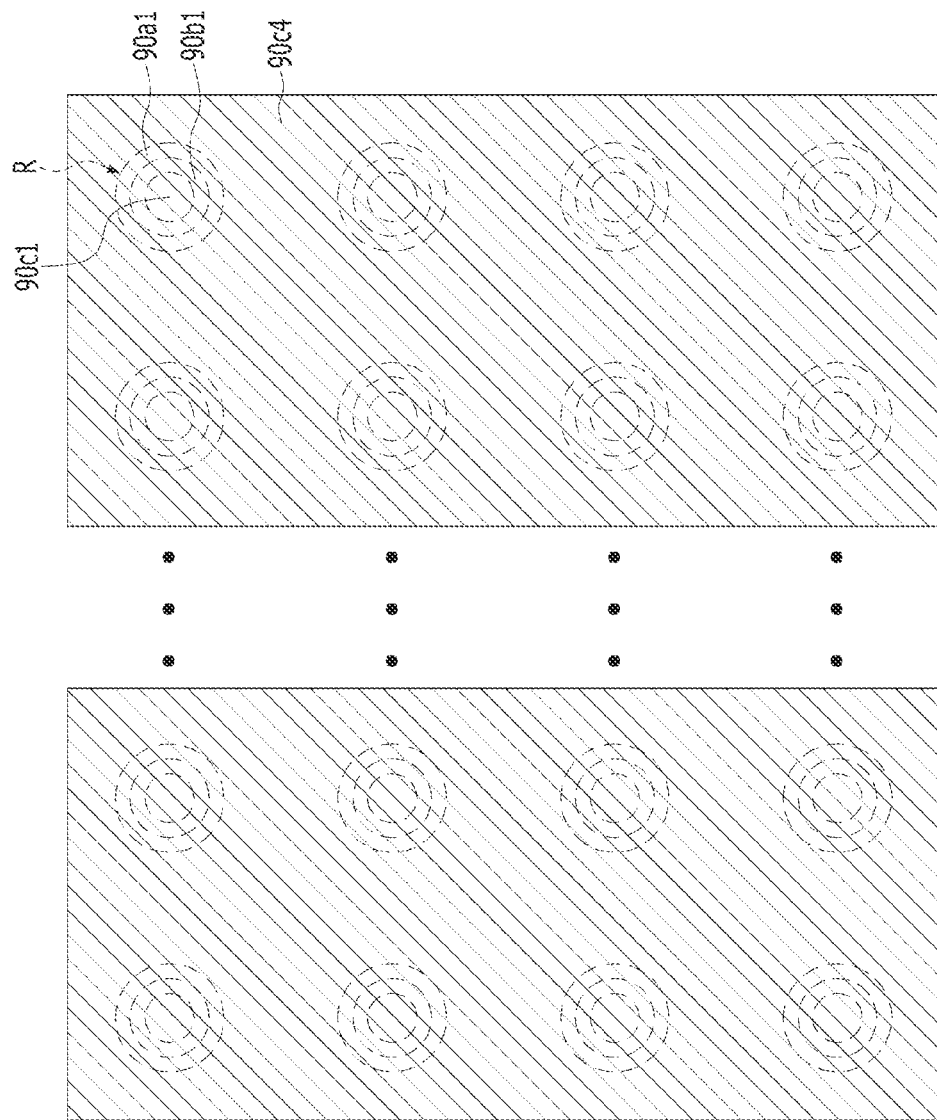

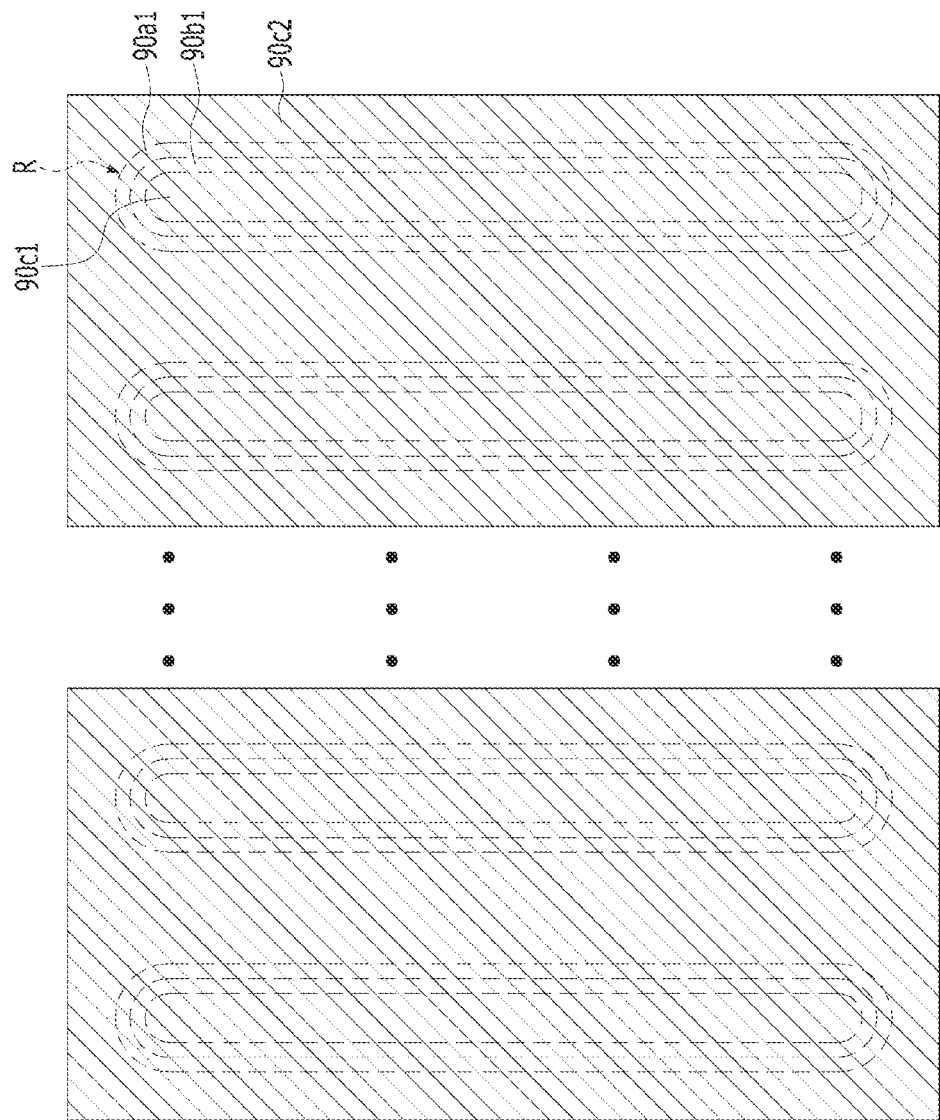

STORAGE SYSTEM INCLUDING A DECOUPLING DEVICE HAVING A PLURALITY OF UNIT CAPACITORS

CROSS-REFERENCE TO RELATED APPLICATION

This application is a continuation application of U.S. patent application Ser. No. 17/148,194, filed on Jan. 13, 2021, and claims priority under 35 U.S.C. § 119(a) to Korean Patent Application No. 10-2020-0104581 filed on Aug. 20, 2020, which is incorporated herein by reference in its entirety.

BACKGROUND

1. Technical Field

This disclosure generally relates to a storage system including a decoupling capacitor having a plurality of unit capacitors and a method of fabricating the storage system.

2. Related Art

As electronic systems become smaller, the size of the storage systems used by the electronic systems also become smaller. In particular, the thickness of storage systems mounted in mobile devices is becoming thinner.

SUMMARY

Embodiments of the present disclosure are directed to a storage system including a decoupling device having a plurality of unit capacitors formed in a semiconductor substrate.

A storage system in accordance with an embodiment of the present disclosure may include a storage device, a control device, and a decoupling device disposed on a circuit substrate. The storage device may receive and store data from the control device. The control device may generate an inner voltage. The decoupling device may be connected to the control device and decouples the inner voltage. The decoupling device may include a plurality of unit capacitors constituting a plurality of decoupling capacitors. Each of the unit capacitors may include a plurality of capacitor elements, a first terminal, and a second terminal. Some of the unit capacitors may be selectively connected with each other to constitute the decoupling capacitors having various capacitances.

A storage system in accordance with an embodiment of the present disclosure may include a storage device, a control device, and a decoupling device disposed on a circuit substrate. The control device may include a first power pad, a second power pad, ground pads, and an internal voltage pad to provide some of voltages generated in the control device to the storage device; external input/output pads to communicate with an external system; and internal input/output pads to communicate with the storage device. The decoupling device may include a plurality of unit capacitors constituting a plurality of decoupling capacitors. Each of the unit capacitors may include a first electrode pad and a second electrode pad. The first power pad of the control device may be electrically connected to the first electrode pad of one of the unit capacitors. The second power pad of the control device may be electrically connected to the first electrode pads of two of the unit capacitors. The ground pads of the control device may be electrically commonly connected to the second electrode pads of the unit capacitors. Each of the unit capacitors may include capacitor elements formed in recesses formed in a base substrate, and a lower electrode, a capacitor dielectric layer, an upper electrode, a first terminal connected with the upper electrode, and a second terminal connected with the lower electrode shared by the capacitor elements. Some of the unit capacitors may be selectively connected with each other to constitute the decoupling capacitors having various capacitances.

A storage system in accordance with an embodiment of the present disclosure may include a storage device, a control device electrically connected to the storage device, and a decoupling device electrically connected to power pads and ground pads of the control device. The decoupling device may include a plurality of unit capacitors. Each of the unit capacitors may include: a buffer insulating layer formed on a base substrate; recesses vertically penetrating the buffer insulating layer to extend into the base substrate, wherein the recesses are arranged to be spaced apart from one another and wherein the recesses are shaped as holes; a lower electrode including lower electrode patterns formed on inner walls and bottoms of the recesses and including lower main connectors formed on an upper surface of the buffer insulating layer to electrically connect to the lower electrode patterns; a capacitor dielectric layer including dielectric patterns formed on the lower electrode patterns formed in the recesses and including a dielectric connection pattern formed on the lower main connectors to physically connect to the dielectric patterns; an upper electrode including upper electrode patterns formed on the dielectric patterns in the recesses to fill the recesses and upper main connectors formed on the dielectric connection pattern to horizontally connect to the upper electrode patterns; and a passivation layer on the upper electrode.

BRIEF DESCRIPTION OF THE DRAWINGS

FIGS. 6A and 6B are longitudinal cross-sectional views taken along line I-I' of FIG. 5, respectively, to schematically illustrate structures of one unit capacitor of decoupling devices in accordance with embodiments of the present disclosure.

FIG. 7A is a side cross-sectional view illustrating recesses of a unit capacitor in accordance with an embodiment of the present disclosure and FIGS. 7B and 7C are cross-sectional views or plan views illustrating the recesses of the unit capacitor.

FIG. 8A is a side cross-sectional view illustrating a lower electrode of a unit capacitor in accordance with an embodiment of the present disclosure, and FIGS. 8B to 8E are cross-sectional views or plan views illustrating the lower electrode of the unit capacitor in accordance with embodiments of the present disclosure.

FIG. 9A is a side cross-sectional view illustrating a capacitor dielectric layer of a unit capacitor in accordance with an embodiment of the present disclosure, and FIGS. 9B to 9D are cross-sectional views or plan views illustrating the capacitor dielectric layer of the unit capacitor in accordance with the embodiments of the present disclosure.

FIG. 10A is a side cross-sectional view illustrating an upper electrode of a unit capacitor in accordance with an embodiment of the present disclosure, and FIGS. 10B to 10E are cross-sectional views or plan views illustrating the upper electrode of the unit capacitor in accordance with embodiments of the present disclosure.

DETAILED DESCRIPTION

Figure 1A:
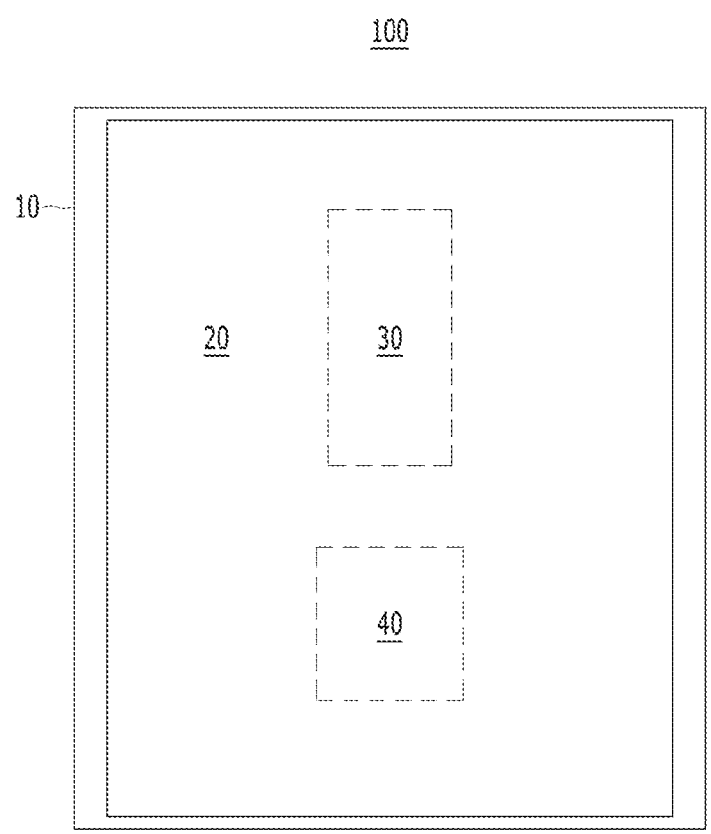
FIG. 1A is a layout schematically illustrating a storage system in accordance with an embodiment of the present disclosure.

Various examples and embodiments of the disclosed technology are described below in detail with reference to the accompanying drawings. The drawings might not be necessarily to scale, and in some instances, proportions of at least some structures in the drawings may be exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and different relative positioning relationships or sequences of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
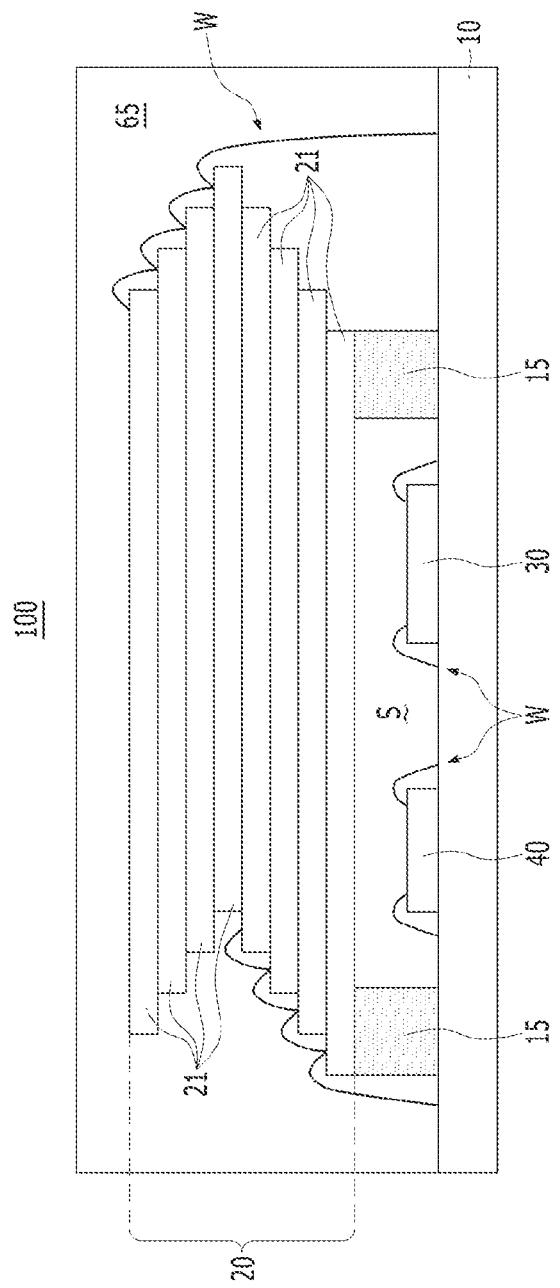
FIG. 1B is a side view of the storage system of FIG. 1A.

FIG. 1A is a layout schematically illustrating a storage system 100 in accordance with an embodiment of the present disclosure. FIG. 1B is a side view of the storage system 100 of FIG. 1A. In order to facilitate understanding of the technical concept of the present disclosure, all devices of FIG. 1A are shown in FIG. 1B.

Referring to FIGS. 1A and 1B, a storage system 100 in accordance with an embodiment of the present disclosure may include a storage device 20, a control device 30, a decoupling device 40, and a molding layer 65 disposed on a circuit substrate 10. The storage system 100 may further include supporting elements 15 disposed on the circuit substrate 10 to support the storage device 20.

The circuit substrate 10 may include a printed circuit board (PCB). In one embodiment, the circuit substrate 10 may include a re-distribution layer (RDL) formed on a silicon substrate.

The storage device 20 may include a plurality of memory devices 21 stacked in a staircase manner. For example, the memory devices 21 may include NAND flash memory devices. The memory devices 21 of the storage device 20 may be electrically connected to the circuit substrate 10 through wires W. The storage device 20 may store data received from the control device 30 or provide the stored data to the control device 30.

The control device 30 may communicate with the storage device 20 based on a signal transmitted from an external system. For example, the control device 30 may receive data from the external system and transmit the data to the storage device 20. The control device 30 may receive data from the storage device 20 and transmit the data to the external system. The control device 30 may receive power from the external system and generate various internal voltages used in the storage system 100. For example, the control device 30 may receive an external voltage (VDD or VCC) from the external system and generate an internal power voltage (VDDi), an internal data power voltage (VDDiQ), a reference voltage (Vref), and other internal voltages. The control device 30 may provide some of the generated various internal voltages to the storage device 20. The control device 30 may be electrically connected to the circuit substrate 10 through the wires W.

The decoupling device 40 may be electrically connected to the circuit substrate 10 through the wires W. The decoupling device 40 may be electrically connected to the control device 30. Some of the various internal voltages generated by the control device 30 may be shared with the decoupling device 40. That is, the decoupling device 40 may decouple some of the various internal voltages generated by the control device 30.

The supporting elements 15 may include dummy chips, insulating dams, or insulating pillars. The supporting elements 15 may space apart the storage device 20 from the circuit substrate 10. The storage device 20 may be stacked on the supporting elements 15. The control device 30 and the decoupling device 40 may be disposed in a space S provided by the storage device 20 and the supporting elements 15. In one embodiment, the space S may be filled with a film over die (FOD), a film on wire (FOW), or an underfill material. In one embodiment, the supporting elements 15 may be omitted.

The molding layer 65 may cover and surround the surface of the circuit substrate 10 and the storage device 20. The molding layer 65 may include an epoxy molding compound (EMC).

Figure 2:
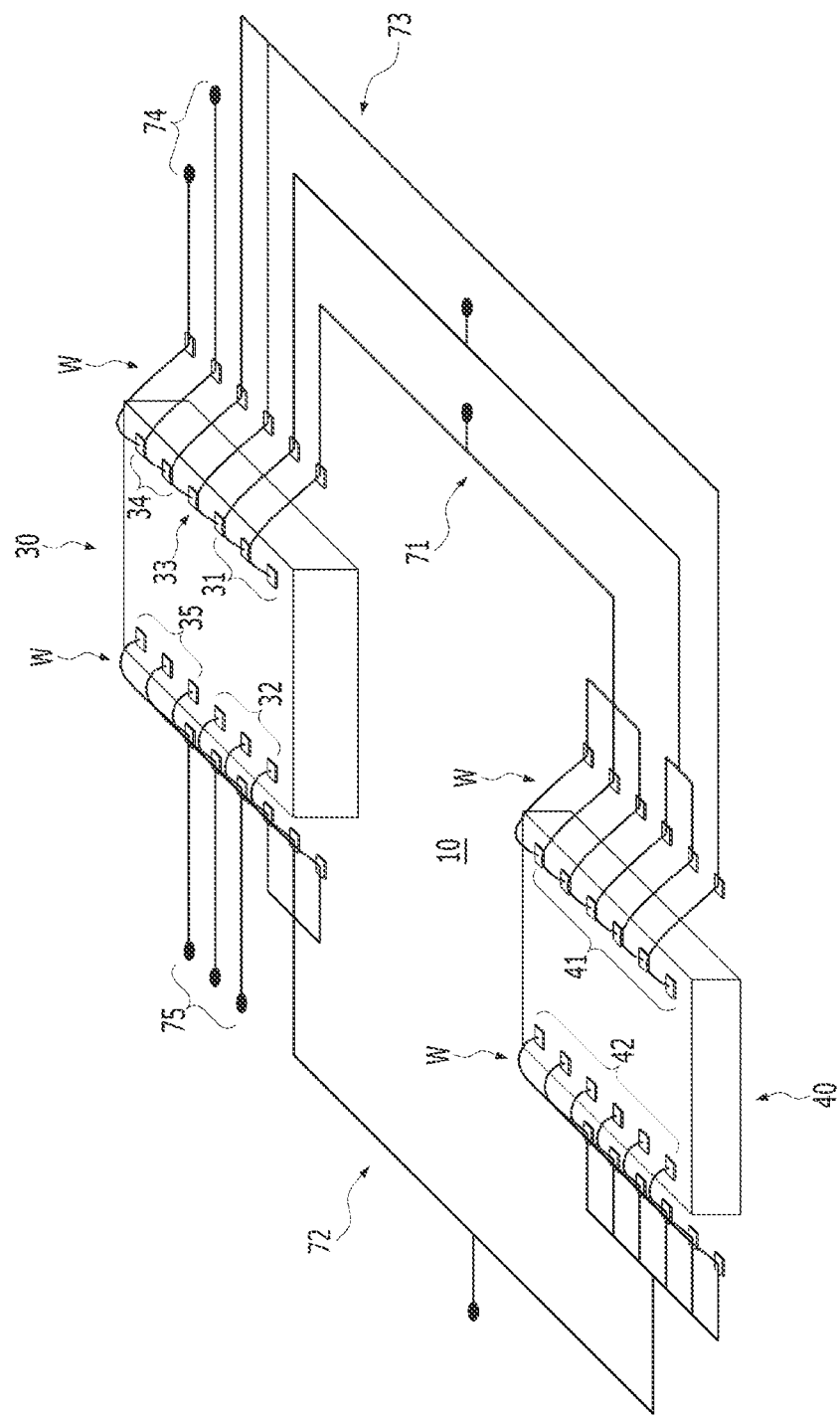
FIG. 2 is a perspective view illustrating electrical connections between a control device and a decoupling device of a storage system in accordance with an embodiment of the present disclosure.

FIG. 2 is a perspective view illustrating electrical connections between the control device 30 and the decoupling device 40 of the storage system 100 in accordance with an embodiment of the present disclosure.

Referring to FIG. 2, the control device 30 and the decoupling device 40 are disposed and mounted on the circuit substrate 10 to be electrically connected to the substrate interconnections 71-75 through wires W, respectively. The substrate interconnections 71-75 may include power interconnections 71, ground interconnections 72, internal voltage interconnections 73, external input/output interconnections 74, and internal input/output interconnections 75.

The control device 30 may include power pads 31, ground pads 32, an internal voltage pad 33, external input/output pads 34, and internal input/output pads 35. The numbers of each of the pads 31 to 35 have been simplified for illustration. That is, the control device 30 may actually include a larger number of pads 31 to 35 than is shown. The power pads 31, the ground pads 32, and the internal voltage pad 33 may provide various voltages generated in the control device 30 to the storage device 20.

The decoupling device 40 may include first and second decoupling pads 41 and 42.

The power pads 31 and the internal voltage pad 33 of the control device 30 may be electrically connected with the first decoupling pads 41 of the decoupling device 40 through the wires W, the power interconnections 71, and the internal voltage interconnections 73.

The ground pads 32 of the control device 30 may be electrically connected with the second decoupling pads 42 of the decoupling device 40 through the wires W and the ground interconnections 72. Accordingly, the decoupling device 40 may decouple the various internal voltages of the control device 30.

The external input/output pads 34 and the internal input/output pads 35 of the control device 30 may be electrically connected with the external system and the storage device 20 through the wires W, the external input/output interconnections 74, and the internal input/output interconnections 75.

The power interconnections 71, the ground interconnections 72, the internal voltage interconnections 73, the external input/output interconnections 73, and the internal input/output interconnections 74 may be buried and embedded in the circuit substrate 10. In one embodiment, one of the power interconnections 71 may be connected to the storage device 20. For example, one of the power interconnections 71 may transmit and provide the reference voltage to the storage device 20.

Figure 3:
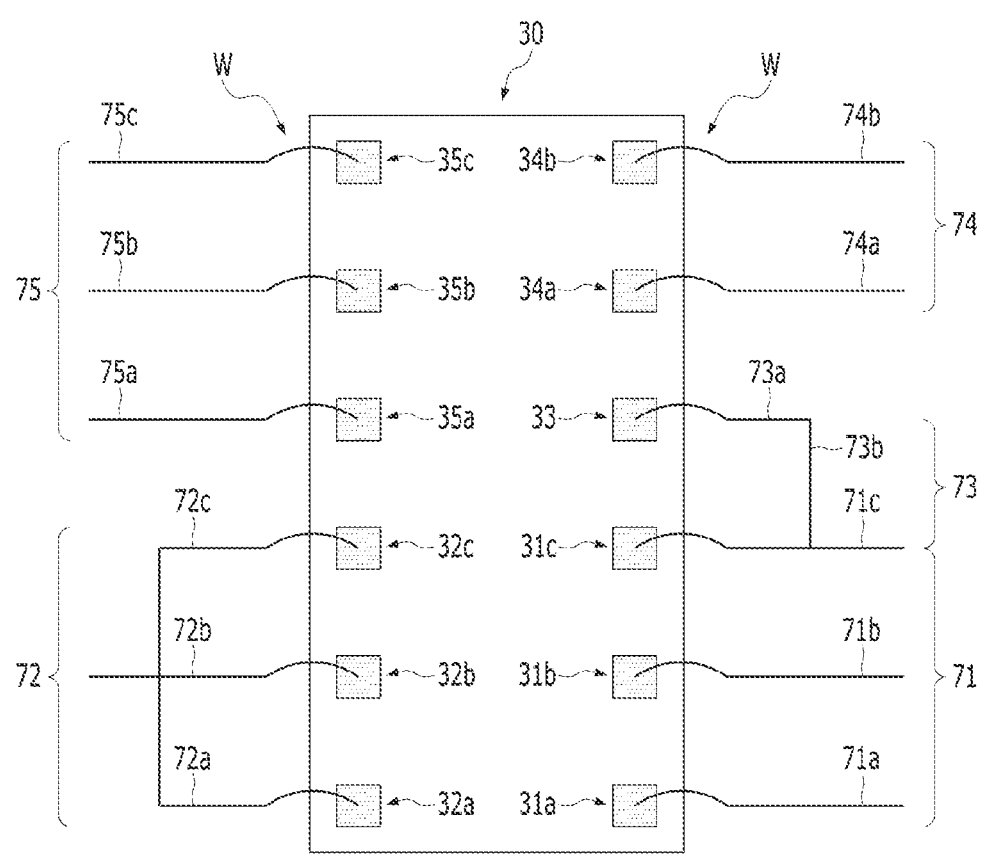
FIG. 3 is a top view illustrating electrical connections of power pads, ground pads, an internal voltage pad, external input/output pads, wires, and substrate interconnections of a control device in accordance with an embodiment of the present disclosure.

FIG. 3 is a top view illustrating electrical connections of the power pads 31a to 31c, the ground pads 32a to 32c, the internal voltage pad 33, the external input/output pads 34a and 34b, internal input/output pads 35a to 35c, the wires W, and the substrate interconnections 71a to 71c, 72a to 72c, 73a and 73b, 74a and 74b, and 75a to 75c of the control device 30 in accordance with an embodiment of the present disclosure.

Referring to FIG. 3, the power pads 31a to 31c of the control device 30 may transmit a power voltage. The ground pads 32a to 32c of the control device 30 may transmit a ground voltage. The internal voltage pad 33 of the control device 30 may be electrically connected to one power pad 31c of the power pads 31a to 31c to transmit an internal voltage. For example, the internal voltage provided through the internal voltage pad 33 may be provided to the control device 30 again. The internal voltage pad 33 may be disposed adjacent to the external input/output pads 34a and 34b. The internal voltage provided through the internal voltage pad 33 may be used as the highest voltage (e.g., VDDiQ) of an external data signal provided through the external input/output pads 34a and 34b. Therefore, the internal voltage pad 33 is disposed adjacent to the external input/output pads 34a and 34b used for data input/output so that the internal voltage can be used as the maximum voltage of the external data signal without voltage noise or with minimized voltage noise. The external input/output pads 34a and 34b of the control device 30 may transmit electrical signals for communicating with the external system. The internal input/output pads 35a to 35c of the control device 30 may deliver electrical signals for communicating with the storage device 20.

The power pads 31a to 31c may be electrically connected to the power interconnections 71a to 71c through the wires W, respectively. The ground pads 32a to 32c may be electrically connected to the ground interconnections 72a to 72c through the wires W, respectively. The internal voltage pad 33 may be electrically connected to the internal voltage interconnections 73a to 73b through the wires W. The first internal voltage interconnection 73a may be electrically connected to the internal voltage pad 33 through the wire W. The second internal voltage interconnection 73b may electrically connect the first internal voltage interconnection 73a to one power interconnection 71c of the power interconnections 71a to 71c. The external input/output pads 34a and 34b and the internal input/output pads 35a to 35c may be electrically connected to the external input/output interconnections 74a and 74b and the internal input/output interconnections 75a to 75c through the wires W, respectively. The ground interconnections 72a to 72c may be unified and connected as one. Accordingly, the ground pads 32a to 32c may be electrically connected to each other through the ground interconnections 72a to 72c.

Figure 4:
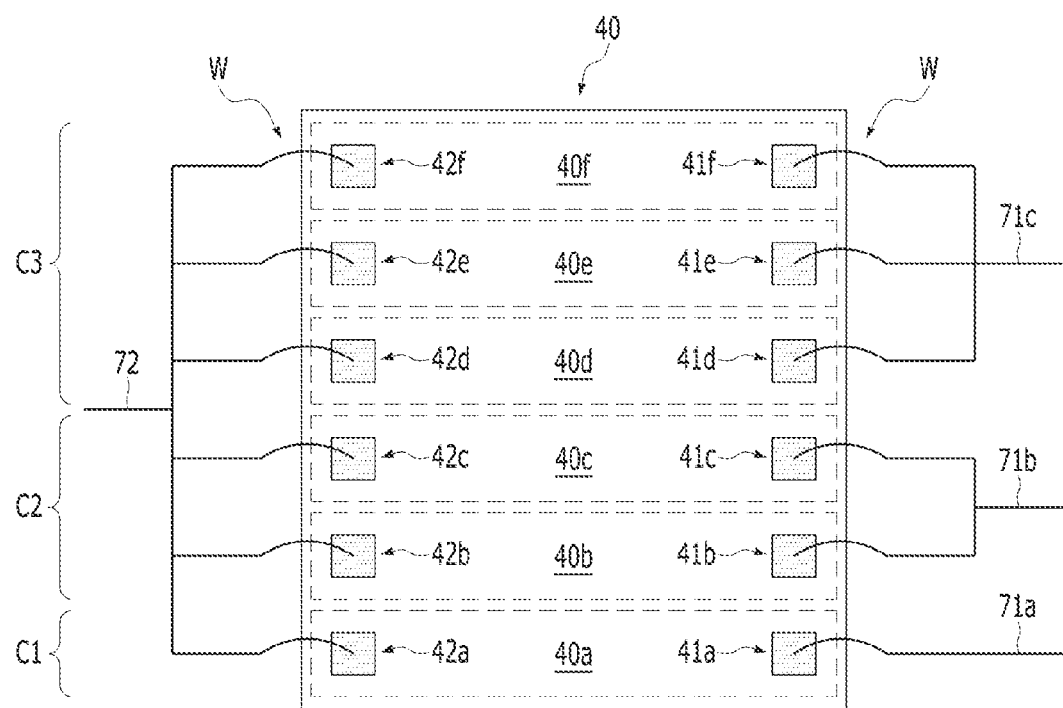
FIG. 4 is a top view schematically illustrating electrical connections of first and second decoupling pads, wires, and substrate interconnections of a decoupling device in accordance with an embodiment of the present disclosure.

FIG. 4 is a top view schematically illustrating electrical connections of the first and second decoupling pads 41a to 41f and 42a to 42f, the wires W, and the substrate interconnections 71a to 71c and 72 of the decoupling device 40 in accordance with an embodiment of the present disclosure.

Referring to FIG. 4, the decoupling device 40 may include a plurality of unit capacitors 40a to 40f. The plurality of unit capacitors 40a to 40f may have the same specifications. For example, the plurality of unit capacitors 40a to 40f may have the same size, the same structure, and the same unit capacitance. Each of the plurality of unit capacitors 40a to 40f may include first decoupling pads 41a to 41f and second decoupling pads 42a to 42f. The first decoupling pads 41a to 41f and the second decoupling pads 42a to 42f of the unit capacitors 40a to 40f may have a capacitive connection. Accordingly, first decoupling pads 41a to 41f and the second decoupling pads 42a to 42f, respectively, can be formed as pairs of electrodes for each of the unit capacitors 40a to 40f.

Some of the unit capacitors 40a to 40f may be selectively connected, so that decoupling capacitors C1 to C3 having various capacitances may be constituted or formed. For example, the first decoupling pad 41a of the first unit capacitor 40a may be electrically connected to the first power interconnection 71a. The second decoupling pad 42a of the first unit capacitor 40a may be electrically connected to the ground interconnection 72. Accordingly, the first unit capacitor 40a may constitute the first decoupling capacitor C1 having the unit capacitance.

The first decoupling pads 41b and 41c of the second and third unit capacitors 40b and 40c may be commonly connected to the second power interconnection 71b. That is, the first decoupling pads 41b and 41c of the second and third unit capacitors 40b and 40c may be electrically connected to each other through the second power interconnection 71b. The second decoupling pads 42b and 42c of the second and third unit capacitors 40b and 40c may be commonly connected to the ground interconnection 72. Accordingly, the second and third unit capacitors 40b and 40c may be connected in parallel between the second power interconnection 71b and the ground interconnection 72. Accordingly, the second and third unit capacitors 40b and 40c may constitute the second decoupling capacitor C2 having twice the unit capacitance.

The first decoupling pads 41d to 41f of the fourth to sixth unit capacitors 40d to 40f may be commonly connected to the third power interconnection 71c. That is, the first decoupling pads 41d to 41f of the fourth to sixth unit capacitors 40d to 40f may be electrically connected with each other through the third power interconnection 71c. The second decoupling pads 42d to 42f of the fourth to sixth unit capacitors 40d to 40f may be commonly connected to the ground interconnection 72. Accordingly, the fourth to sixth unit capacitors 40d to 40f may be connected in parallel between the third power interconnection 71c and the ground interconnection 72. Accordingly, the fourth to sixth unit capacitors 40d to 40f may constitute the third decoupling capacitor C3 having three times the unit capacitance.

The decoupling capacitors C1 to C3 including one or more of the unit capacitors 40a to 40f may have capacitances equal to an integer multiple of the unit capacitance. In the embodiment, the decoupling device 40 is illustrated as having six unit capacitors 40a to 40f for constituting the three decoupling capacitors C1 TO C3, but is not limited thereto. In various embodiments, the decoupling device 30 may include a greater number of unit capacitors than the number of the unit capacitors 40a to 40f shown in FIG. 4. Accordingly, a larger number of decoupling capacitors having various capacitances may be variously constituted and included in one decoupling device 40.

Referring to FIGS. 3 and 4, the first power pad 31a of the control device 30 and the first decoupling pad 41a of the first unit capacitor 40a of the decoupling device 40 may be electrically connected with each other through the first power interconnection 71a. The second power pad 31b of the control device 30 and the first decoupling pads 41b and 41c of the second and third unit capacitors 40b and 40c of the decoupling device 40 may be electrically connected with other through the second power interconnection 71b. The third power pad 31c of the control device 30 and the first decoupling pads 41d to 41f of the fourth to sixth unit capacitors 40d to 40f of the decoupling device 40 may be electrically connected with each other through the third power interconnection 71c. The ground pads 32a to 32c of the control device 30 and the second decoupling pads 42a to 42f of the first to sixth unit capacitors 40a to 40f of the decoupling device 40 may be commonly electrically connected with other through the ground interconnection 72. For example, all the ground pads 32a to 32c of the control device 30 and the second decoupling pads 42a to 42f of all the unit capacitors 40a to 40f of the decoupling device 40 may be electrically connected with each other.

The first decoupling capacitor C1 may decouple the first voltage of the control device 30, the second decoupling capacitor C2 may decouple the second voltage of the control device 30, and the third decoupling capacitor C3 may decouple the third voltage of the control device 30. The decoupling device 40 in accordance with an embodiment of the present disclosure may decouple various powers (e.g., voltages) of the control device 30. The first to third voltages may be different voltages from each other.

Figure 5:
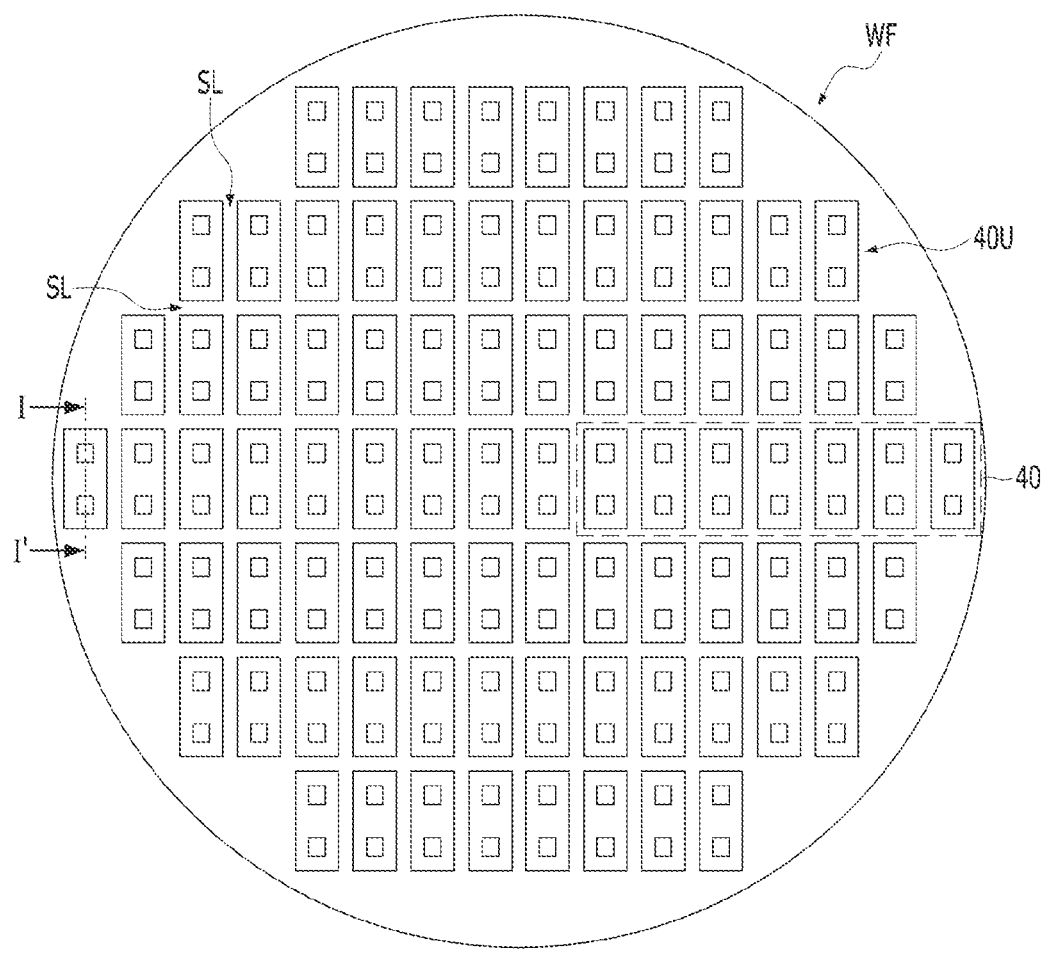
FIG. 5 is a top view schematically illustrating a wafer on which a plurality of unit capacitors are formed in accordance with an embodiment of the present disclosure.

FIG. 5 is a top view schematically illustrating a wafer WF on which a plurality of unit capacitors 40U are formed in accordance with an embodiment of the present disclosure. Referring to FIG. 5, the plurality of unit capacitors 40U may be integrated on the wafer WF through a semiconductor manufacturing process. The plurality of unit capacitors 40U may be spaced apart from each other in a row direction and a column direction by scribe lanes SL. The unit capacitors 40a-40f shown in FIG. 4 may be some of the plurality of unit capacitors 40U. That is, one decoupling device 40 shown in FIG. 4 may be manufactured by sawing or cutting the plurality of unit capacitors 40U to be constituted as a single chip. Referring to FIGS. 4 and 5, the decoupling device 40 may be manufactured by sawing or cutting a part of the wafer WF along the scribe lanes SL so that the six unit capacitors 40U constitute the single chip. In the present disclosure, it has been described that one decoupling device 40 includes six unit capacitors 40U, but as mentioned above, it is not limited thereto. For example, one decoupling device 40 may include any number of unit capacitors 40U.

Figure 6B:
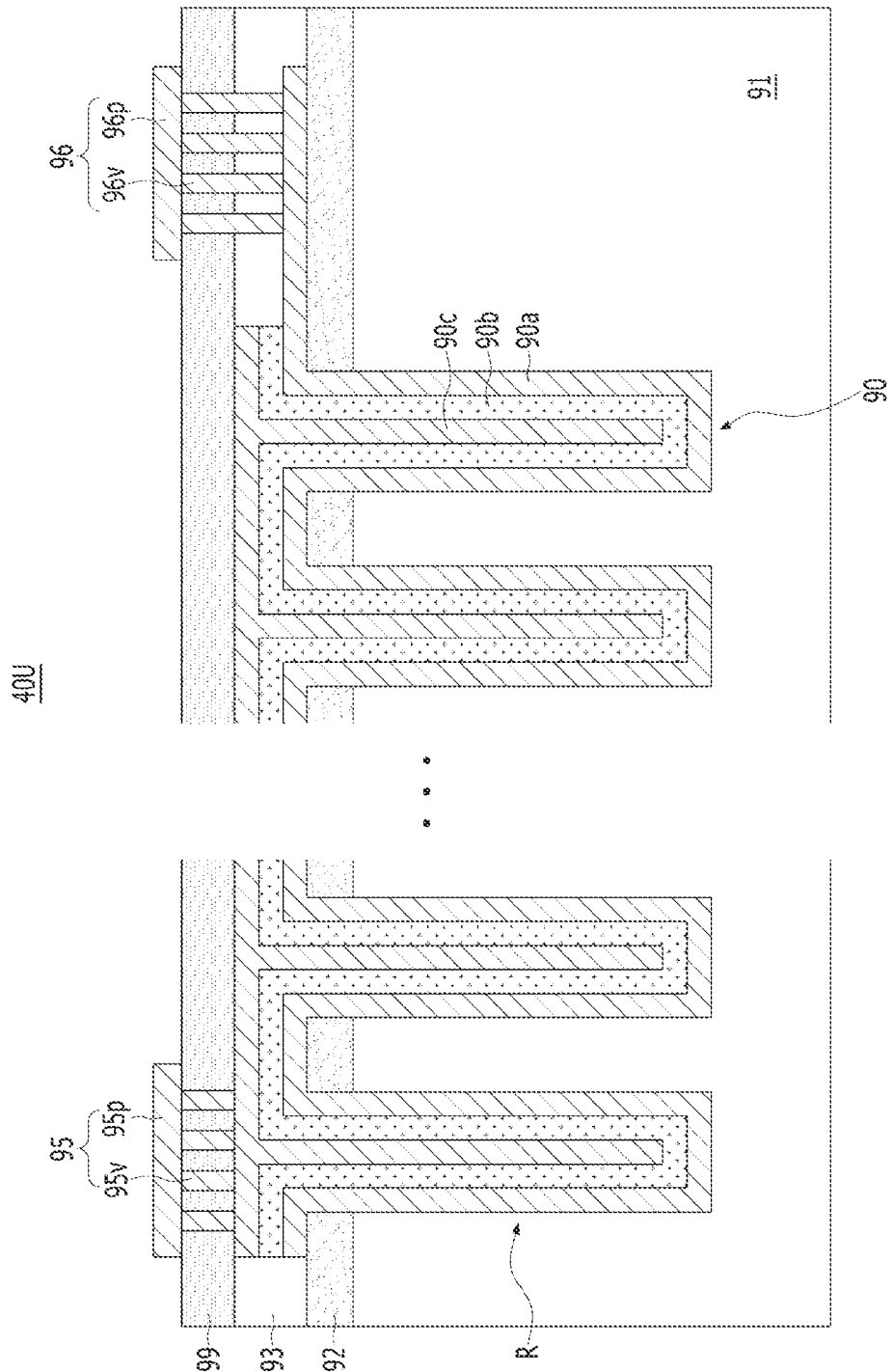

FIGS. 6A and 6B are longitudinal cross-sectional views taken along line I-I' of FIG. 5, respectively, to schematically illustrate structures of one unit capacitor 40U of the decoupling devices 40 in accordance with embodiments of the present disclosure. Referring to FIG. 6A, a unit capacitor 40U in accordance with an embodiment of the present disclosure may include a plurality of capacitor elements 90 formed in a base substrate 91, and a first terminal 95 and a second terminal 96 formed on the base substrate 91. The unit capacitor 40U may include a lower electrode 90a, a capacitor dielectric layer 90b, and an upper electrode 90c shared by or forming the capacitor elements 90. The first terminal 95 may include first electrode vias 95v and a first electrode pad 95p. The second terminal 96 may include second electrode vias 96v and a second electrode pad 96p. In one embodiment, the second terminal 96 may further include intermediate vias 96v' and an intermediate pad 96p'. The unit capacitor 40U may further include a buffer insulating layer 92, an interlayer insulating layer 93, and a passivation layer 99. With further reference to FIGS. 2 and 4, the first terminal 95 and the second terminal 96 may correspond to the first decoupling pads 41 and 41a-41f and the second decoupling pads 42 and 42a-42f. The 'first' and the 'second' can be interchangeable.

The base substrate 91 may include a semiconductor substrate such as a silicon wafer. In one embodiment, the base substrate 91 may include an insulating layer formed on a semiconductor substrate. The insulating layer may include a silicon oxide layer or a silicon nitride layer.

Each of the capacitor elements 90 may be formed in recesses R formed in the base substrate 91. Specifically, the lower electrode 90a of each capacitor element 90 may be conformally formed on inner walls and bottom surfaces of the recessed R vertically penetrating the buffer insulating layer 92 formed on the base substrate 91 and extending vertically downwardly in the base substrate 91. The lower electrode 90a may be formed to extend horizontally on the surface of the buffer insulating layer 92. The capacitor dielectric layer 90b may be conformally formed on a surface of the lower electrode 90a. The upper electrode 90c may be conformally formed on a surface of the capacitor dielectric layer 90b. The upper electrode 90c may completely fill the recesses R. For example, in the recesses R, the lower electrode 90a and the capacitor dielectric layer 90b may have a cylinder shape, and the upper electrode 90c may have a pillar shape.

The lower electrode 90a and the upper electrode 90c may include a metal compound such as metal silicide. For example, the lower electrode 90a and the upper electrode 90c may include one of titanium silicide (TiSi), tungsten silicide (WSi), nickel silicide (NiSi), cobalt silicide (CoSi), or other metal silicide. In one embodiment, the lower electrode 90a and the upper electrode 90c may include metal. For example, the lower electrode 90a and the upper electrode 90c may include one of a metal such as tungsten (W), titanium (Ti), nickel (Ni), cobalt (Co), or copper (Cu). The capacitor dielectric layer 90b may include a single insulating layer or multiple insulating layers. For example, the capacitor dielectric layer 90b may include one of hafnium oxide ($HfO_2$), aluminum oxide ($Al_2O_3$), silicon oxide ($SiO_2$), silicon nitride (SiN), titanium oxide (TiO), zirconium oxide (ZrO), or other insulating materials.

The buffer insulating layer 92 may be formed on the base substrate 91 to separate and electrically insulate the upper portion of the lower electrode 90a from the base substrate 91. Also, the buffer insulating layer 92 may be used as an etching mask for forming the recesses R. The interlayer insulating layer 93 may surround side surfaces of the lower electrode 90a, the capacitor dielectric layer 90b, and the upper electrode 90c positioned on the base substrate 91 and the buffer insulating layer 92. The interlayer insulating layer 93 may further surround exposed portions of the lower electrode 90a, and side surfaces of the intermediate via 96v' and the intermediate pad 96p' of the second terminal 96. The passivation layer 99 may be formed on a surface of the upper electrode 90c and an upper surface of the interlayer insulating layer 93. The passivation layer 99 may surround side surfaces of the first electrode via 95v and the second electrode via 96v and expose the first electrode pad 95p and the second electrode pad 96p. The buffer insulating layer 92 and the interlayer insulating layer 93 may include at least one of a silicon oxide layer, a silicon nitride layer, or other silicon-based insulating material layer. The passivation layer 99 may include at least one of silicon nitride, aluminum oxide, or s polymer resin such as polyimide.

Referring to FIG. 6B, the unit capacitor 40U in accordance with an embodiment of the present disclosure may include a plurality of capacitor elements 90 formed in the base substrate 91, and the first terminal 95 and the second terminal 96 formed on the base substrate 91. Compared with the unit capacitor 40U shown in FIG. 6A, the second electrode via 96v of the second terminal 96 may be directly connected to the lower electrode 90a of the capacitor elements 90. For example, the intermediate via 96v' and the intermediate pad 96p' of FIG. 6A may be omitted. The second electrode via 96v of the second terminal 96 may vertically penetrate the passivation layer 99 and the interlayer insulating layer 93.

The unit capacitor 40U in accordance with an embodiment of the present disclosure includes the plurality of capacitor elements 90 having a pillar shape vertically extending in the base substrate 91, so that the unit capacitor 40U can have a high capacitance within a small occupied area. Accordingly, the unit capacitor 40U may have a size smaller than that of a multilayered ceramic capacitor/condenser (MLCC). Specifically, since a vertical thickness of the unit capacitor 40U can be greatly reduced, the unit capacitor 40U can be applied more to a mobile device.

Figure 7C:
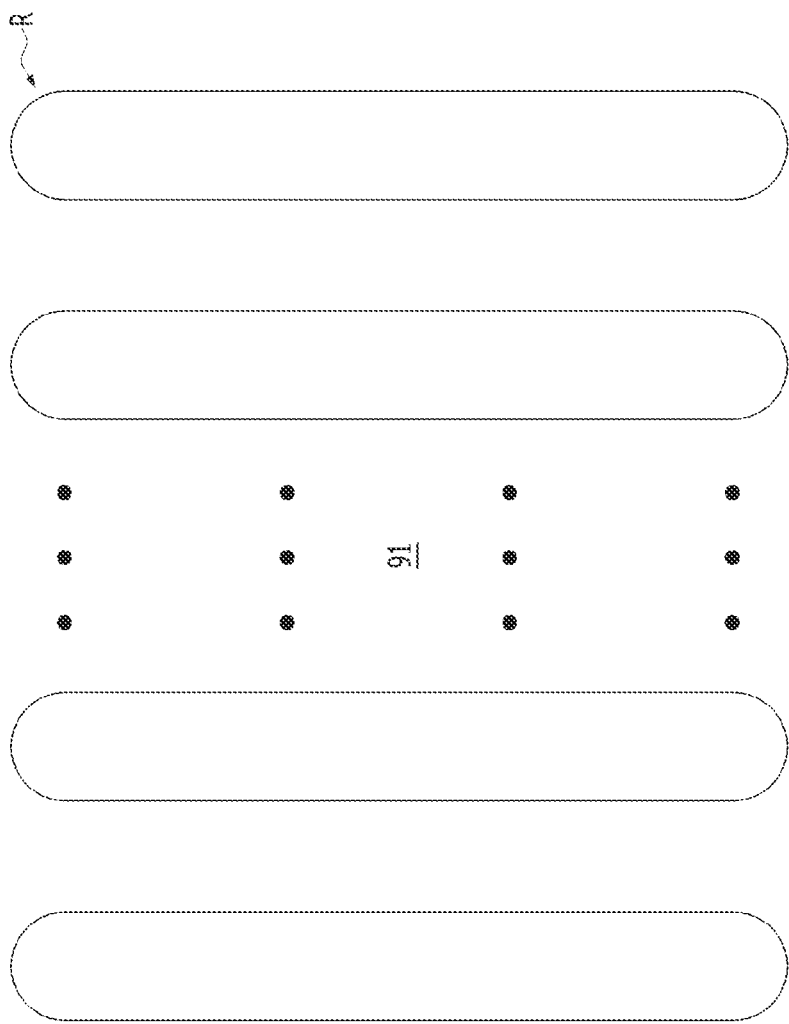

FIG. 7A is a side cross-sectional view illustrating the recesses R of the unit capacitor 40U in accordance with an embodiment of the present disclosure and FIGS. 7B and 7C are cross-sectional views or plan views illustrating the recesses R of the unit capacitor 40U. Referring to FIGS. 7A and 7B, the recesses R of the unit capacitor 40U may be periodically arranged to be spaced apart from each other at regular intervals in a two-dimensional array, for example, in a row direction and a column direction. In a top view, the recesses R may have a circle shape. In a side view, the recesses R may have a hole shape extending from the surface to the inside of the base substrate 91. Referring to FIGS. 7A and 7C, in the top view, the recesses R may be arranged in the shape of lines or the shape of segments extending in parallel with one another in one direction. In the side view, the recesses R may have the shape of trenches formed in the base substrate 91.

FIG. 8A is a side cross-sectional view illustrating the lower electrode 90a of the unit capacitor 40U in accordance with an embodiment of the present disclosure, and FIGS. 8B to 8E are cross-sectional views or plan views illustrating the lower electrode 90a of the unit capacitor 40U in accordance with embodiments of the present disclosure. The dotted lines indicate continuation of the illustrated patterns.

Referring to FIGS. 8A and 8B, the lower electrode 90a of the unit capacitor 40U may include lower electrode patterns 90a1 filling the recesses R, and lower main connectors 90a2 electrically connecting the lower electrode patterns 90a1. In a cross-sectional view or a plan view, the lower electrode patterns 90a1 may have a ring shape formed in the recesses R. In the cross-sectional view or the plan view, the lower main connectors 90a2 may have a segment shape connecting the lower electrode patterns 90a1 in the row direction and the column direction. The row direction may be a first horizontal direction and the column direction may be a second horizontal direction. The row direction and the column direction, i.e., the first horizontal direction and the second horizontal direction may be perpendicular to each other. The lower main connectors 90a2 may be arranged in a mesh shape. With further reference to FIG. 6A or 6B, the lower main connectors 90a2 may be formed on the buffer insulating layer 92.

Referring to FIG. 8C, the lower electrode 90a of the unit capacitor 40U may include lower electrode patterns 90a1, lower main connectors 90a2, and lower sub-connectors 90a3. The lower sub-connectors 90a3 may have a segment shape or a line shape electrically connecting the lower main connectors 90a2 in the row direction and the column direction. The lower sub-connectors 90a3 may be arranged in a mesh shape. The lower main connectors 90a2 and the lower sub-connectors 90a3 may form a mesh shape, respectively or together. The lower sub-connectors 90a3 may be formed at the same level as the lower main connectors 90a2. The lower sub-connectors 90a3 may have a wider width than the lower main connectors 90a2.

Referring to FIG. 8D, the lower electrode 90a of the unit capacitor 40U may include lower electrode patterns 90a1 and lower connectors 90a4. The lower connector 90a4 may have a plate shape. That is, with further reference to FIGS. 6A, 6B, and 8A, the lower connector 90a4 may be entirely formed on the buffer insulating layer 92.

Referring to FIG. 8E, the lower electrode 90a of the unit capacitor 40U may include lower electrode patterns 90a1 formed in the recesses R having the trench shape and the lower connector 90a4 having the plate shape. That is, with further reference to FIG. 7C, the lower electrode patterns 90a1 may be formed in the recesses R having the trench shape.

Figure 9D:
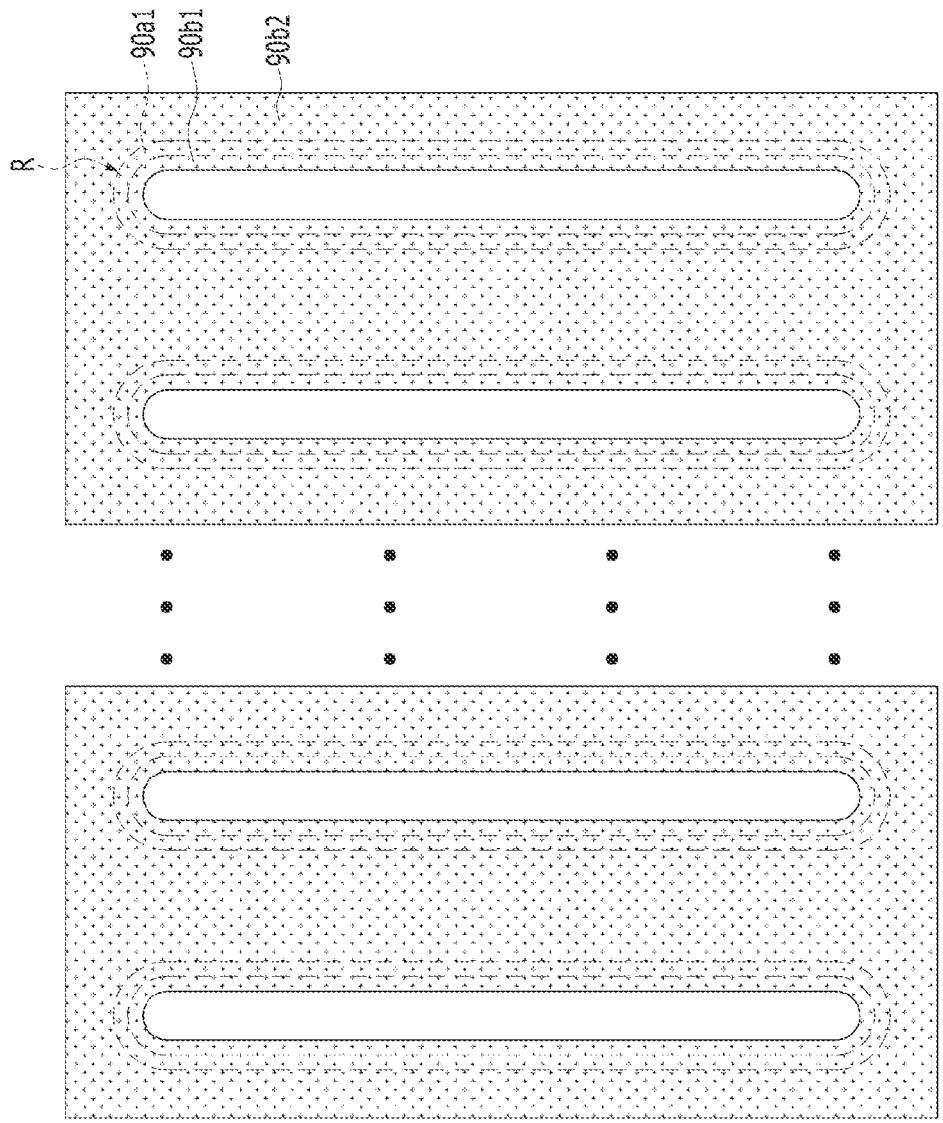

FIG. 9A is a side cross-sectional view illustrating the capacitor dielectric layer 90b of the unit capacitor 40U in accordance with an embodiment of the present disclosure, and FIGS. 9B to 9D are cross-sectional views or plan views illustrating the capacitor dielectric layer 90b of the unit capacitor 40U in accordance with the embodiments of the present disclosure. Referring to FIGS. 9A and 9B, the capacitor dielectric layer 90b of the unit capacitor 40U may have dielectric patterns 90b1 formed on inner walls of the lower electrode patterns 90a1 in the recesses R. In the cross-sectional view or the plan view, the dielectric patterns 90b1 may have a ring shape.

Referring to FIG. 9C, the capacitor dielectric layer 90b of the unit capacitor 40U may include dielectric patterns 90b1 and dielectric connection patterns 90b2. The dielectric connection patterns 90b2 may be entirely formed on the buffer insulating layer 92 and the lower electrode 90a shown in FIG. 6A or 6B to physically connect the dielectric patterns 90b1. The dielectric connection patterns 90b2 may have a plate shape. Thus, the dielectric patterns 90b1 may be physically connected and integrated into one.

Referring to FIG. 9D, the capacitor dielectric layer 90b of the unit capacitor 40U may include dielectric patterns 90b1 formed on inner walls of the lower electrode patterns 90a1 formed in the trench-shaped recesses R and a dielectric connection pattern 90b2. With further reference to FIGS. 6A, 6B, and 8B to 8E, the dielectric connection pattern 90b2 may be entirely formed on the lower main connectors 90a2, the lower connector 90a4 and the lower sub-connectors 90a3 of the lower electrode 90a.

FIG. 10A is a side cross-sectional view illustrating the upper electrode 90c of the unit capacitor 40U in accordance with an embodiment of the present disclosure, and FIGS. 10B to 10E are cross-sectional views or plan views illustrating the upper electrode 90c of the unit capacitor 40U in accordance with embodiments of the present disclosure. Referring to FIGS. 10A and 10B, the upper electrode 90c of the unit capacitor 40U may include upper electrode patterns 90c1 filling insides of the dielectric patterns 90b1 in the recesses R and upper main connectors 90c2 electrically connecting the upper electrode patterns 90c1. In a cross-sectional view or a plan view, the upper electrode patterns 90c1 may have a circular shape formed in the dielectric patterns 90b1 in the recesses R. In the cross-sectional view or the plan view, the upper main connectors 90c2 may have a segment shape or a mesh shape connecting the upper electrode patterns 90c1 in the row direction and the column direction. With further reference to FIGS. 6A and 6B, and 9A to 9D, the upper main connectors 90c2 may be entirely formed on the dielectric patterns 90b1 and the dielectric connection patterns 90b2.

Referring to FIG. 10C, the upper electrode 90c of the unit capacitor 40U may include upper electrode patterns 90c1, upper main connectors 90c2, and upper sub-connectors 90c3. The upper sub-connectors 90c3 may have a segment shape or a line shape that directly connects the upper main connectors 90c2 in the row direction and the column direction. The upper sub-connectors 90c3 may be arranged in a mesh shape. The upper main connectors 90c2 and the upper sub-connectors 90c3 may be formed at the same level. The upper main connectors 90c2 and the upper sub-connectors 90c3 may form a mesh shape, respectively or together.

Referring to FIG. 10D, the upper electrode 90c of the unit capacitor 40U may include upper electrode patterns 90c1 and upper connectors 90a4. The upper connector 90a4 may have a plate shape. That is, with further reference to FIGS. 9B and 9C, the upper connector 90a4 may be entirely formed on the dielectric connection pattern 90b2 of the capacitor dielectric layer 90b.

Referring to FIG. 10E, the upper electrode 90c of the unit capacitor 40U may include upper electrode patterns 90c1 formed in the trench-shaped recesses R and the plate-shaped upper connector 90c4. That is, with further reference to FIG. 7C, the upper electrode patterns 90c1 may be formed in the trench-shaped recesses R. With further reference to FIG. 9D, the upper electrode patterns 90c1 may be formed on inner walls of the dielectric patterns 90b1 in the recesses R and the upper connector 90c4 may be formed on the dielectric connection pattern 90b2.

Figure 11:
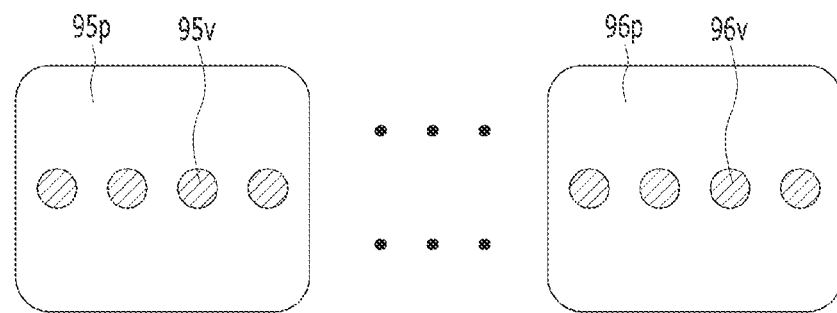
FIG. 11 is a layout or a top view illustrating first electrode vias and first electrode pads of first terminal and second electrode vias and second electrode pads of a second terminal of a unit capacitor in accordance with an embodiment of the present disclosure.

FIG. 11 is a layout or a top view illustrating first electrode vias 95v and first electrode pads 95p of the first terminal 95 and second electrode vias 96v and the second electrode pads 96p of the second terminal 96 the unit capacitor 40U in accordance with an embodiment of the present disclosure. Referring to FIG. 11, the first electrode vias 95v and the first electrode pad 95p of the first terminal 95 of the unit capacitor 40U may vertically overlap.

Figure 12:
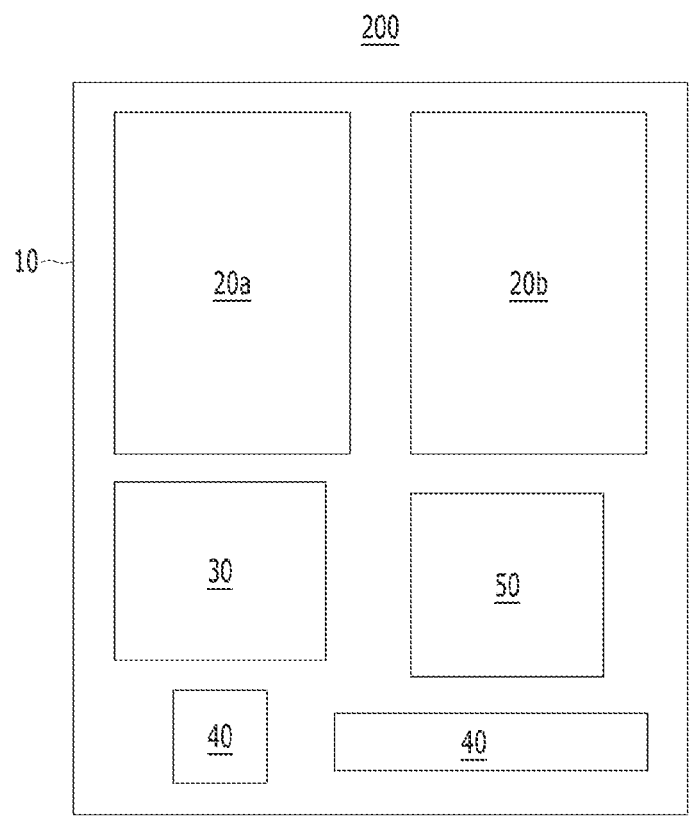
FIG. 12 is a schematic layout illustrating a storage system in accordance with an embodiment of the present disclosure.

FIG. 12 is a schematic layout illustrating a storage system 200 in accordance with an embodiment of the present disclosure. Referring to FIG. 12, the storage system 200 may include storage devices 20a and 20b, a control device 30, a decoupling device 40, and a buffer memory 50, and a power device 60 disposed on a circuit substrate 10. The storage devices 20a and 20b may include a first storage device 20a and a second storage device 20b. Each of the first storage device 20a and the second storage device 20b may independently communicate with the control device 30. With further reference to FIG. 1B, each of the first storage device 20a and the second storage device 20b may include a plurality of stacked NAND flash memory devices. For example, the controller 30 may temporarily store data before being input to the storage device 20 or data output from the storage device 20 in the buffer memory 50. The power device 60 may include a power management integrated circuit (PMIC). The power device 60 may appropriately convert, distribute, and control various powers. The elements that are not described may be understood with reference to FIGS. 1A and 1B. In the embodiment, the control device 30 and the decoupling device 40 may be electrically connected.

Figure 13:
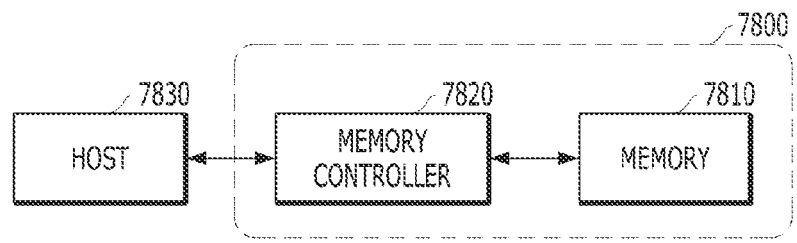
FIG. 13 shows a block diagram illustrating an electronic system employing a memory card including a semiconductor package, according to an embodiment of the present disclosure.

FIG. 13 shows a block diagram illustrating an electronic system including a memory card 7800 employing at least one of the semiconductor packages according to described embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages 100 and 101 according to described embodiments.

The memory 7810 may include a nonvolatile memory device to which the technology of an embodiment of the present disclosure is applied. The memory controller 7820 may control the memory 7810 such that stored data is read out or data is stored in response to a read/write request from a host 7830.

Figure 14:
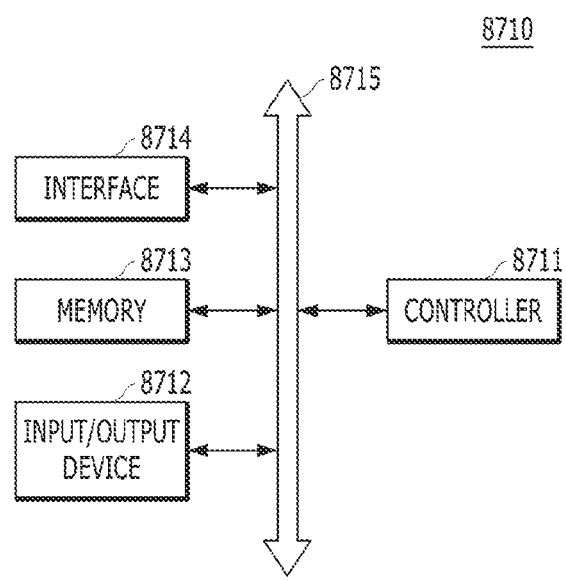
FIG. 14 shows a block diagram illustrating another electronic system including a semiconductor package, according to an embodiment of the present disclosure.

FIG. 14 shows a block diagram illustrating an electronic system 8710 including at least one of the semiconductor packages 100 and 101 according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages 100 and 101 according to the embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device, such as a DRAM device, and/or a nonvolatile memory device, such as a flash memory device. For example, flash memory may be mounted to an information processing system such as a mobile terminal or a desktop computer. The flash memory may constitute a solid-state drive (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

According to embodiments of the present disclosure, a storage system may include a decoupling capacitor having a thinner vertical thickness than MLCCs (multi layered ceramic capacitors/condensers). Thus, the storage system can be miniaturized and slimmer to be suitable for mobile devices.

While this disclosure contains many specifics, these should not be construed as limitations on the scope of the present teachings or of what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few embodiments and examples are described. Other embodiments, enhancements, and variations can be made based on what is described and illustrated in this patent document.

What is claimed is:

1. A electronic system comprising:
   a substrate; and
   a control device and a decoupling device disposed on the substrate,
   wherein the control device comprises:
     power pads;
     ground pads;
     an internal voltage pad;
     an external input/output pad; and
     an internal input/output pad,
   wherein the decoupling device comprises a plurality of first decoupling pads and a plurality of second decoupling pads,
   wherein the power pads of the control device are electrically connected to some of the plurality of first decoupling pads of the decoupling device, and
   wherein the ground pads of the control device are electrically connected to some of the plurality of second decoupling pads of the decoupling device.

2. The electronic system of claim 1, wherein the substrate comprises:
   power interconnections electrically connecting power pads of the control device to the some of the plurality of first decoupling pads of the decoupling device, and
   an internal voltage interconnection electrically connecting an internal voltage pad to second one of the plurality of first decoupling pads of the decoupling device.

3. The electronic system of claim 2, further comprising:
   a storage device to store data,
   wherein the substrate further comprises:
     an external input/output interconnection electrically connecting the external input/output pad of the control device to an external system; and
     an internal input/output interconnection electrically connecting the internal input/output pad of the control device to the storage device.

4. The electronic system of claim 1,
   wherein the substrate comprises ground interconnections electrically connecting the ground pads of the control device to the some of the plurality of second decoupling pads of the decoupling device.

5. The electronic system of claim 1,
   wherein the power pads comprises a first power pad and a second power pad,
   wherein the first power pad is electrically connected to first number of the first decoupling pads,
   wherein the second power pad is electrically connected to second number of the first decoupling pads, and
   wherein the first number is different from the second number.

6. The electronic system of claim 5,
   wherein the power pads further comprise a third power pad,
   wherein the third power pad is electrically connected to third number of the first decoupling pads, and
   wherein the third number is different from the first number and the second number.

7. The electronic system of claim 1,
   wherein the decoupling device comprises a plurality of unit capacitors,
   wherein the plurality of unit capacitors have substantially same capacitance.

8. The electronic system of claim 7,
   wherein each of the plurality of unit capacitors has a first terminal and a second terminal, wherein each the first terminal is each of the first decoupling pads, and wherein each the second terminal is each of the second decoupling pads.

9. The electronic system of claim 1, wherein the some of the plurality of second decoupling pads of the decoupling device are electrically connected to one another.

10. A decoupling capacitor comprising:

a plurality of unit capacitors constituting a plurality of decoupling capacitors;

each of the unit capacitors comprises a plurality of capacitor elements, a first terminal, and a second terminal; and some of the unit capacitors are selectively connected with each other to constitute the decoupling capacitors having various capacitances.

11. The decoupling capacitor of claim 10, wherein the plurality of capacitor elements comprise a lower electrode, a capacitor dielectric layer, and an upper electrode formed in recesses formed in a base substrate;

wherein the first terminal is connected to the upper electrode; and wherein the second terminal is connected to the lower electrode.

12. The decoupling capacitor of claim 11, wherein the recesses have a shape of holes extending from a surface to an inside of the base substrate and are periodically arranged to be spaced apart from one another.

13. The decoupling capacitor of claim 11, wherein the lower electrode comprises:

lower electrode patterns formed on inner walls of the recesses; and lower connectors formed on a buffer insulating layer on the base substrate to horizontally extend and electrically connect the lower electrode patterns.

14. The decoupling capacitor of claim 13, wherein the lower connectors comprises:

lower main connectors electrically connecting the lower electrode patterns; and lower sub-connectors electrically connecting the lower main connectors.

15. The decoupling capacitor of claim 14, wherein both the lower main connectors and the lower sub-connectors form a mesh shape.

16. The decoupling capacitor of claim 13, wherein the capacitor dielectric layer comprises dielectric patterns formed on inner walls of the lower electrode patterns in the recesses.

17. The decoupling capacitor of claim 16, wherein the upper electrode comprises:

upper electrode patterns formed on inner walls of the dielectric patterns to fill the recesses; and upper connectors formed on the buffer insulating layer on the base substrate to horizontally extend and electrically connect the upper electrode patterns.

18. The decoupling capacitor of claim 17, wherein the upper connectors comprises:

upper main connectors directly electrically connecting the upper electrode patterns; and upper sub-connectors directly electrically connecting the upper main connectors.

19. The decoupling capacitor of claim 18, wherein the first terminal comprises electrode vias and an electrode pad, wherein the electrode vias vertically overlap the upper connectors, and wherein the electrode vias vertically extend to electrically connect the upper connectors to the electrode pad.

* * * * *